United States Patent
Kimura

(10) Patent No.: US 9,041,202 B2
(45) Date of Patent: May 26, 2015

(54) SEMICONDUCTOR DEVICE AND MANUFACTURING METHOD OF THE SAME

(75) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 498 days.

(21) Appl. No.: 12/434,948

(22) Filed: May 4, 2009

(65) Prior Publication Data

US 2009/0283762 A1 Nov. 19, 2009

(30) Foreign Application Priority Data

May 16, 2008 (JP) ................................. 2008-130162

(51) Int. Cl.
*H01L 33/00* (2010.01)
*H01L 33/02* (2010.01)
*H01L 27/12* (2006.01)
*H01L 49/02* (2006.01)
(Continued)

(52) U.S. Cl.
CPC ............. *H01L 33/02* (2013.01); *H01L 27/1225* (2013.01); *H01L 27/3262* (2013.01); *H01L 27/3265* (2013.01); *H01L 28/40* (2013.01); *H01L 29/7869* (2013.01); *H01L 27/1288* (2013.01); *H01L 2924/0002* (2013.01); *H01L 27/124* (2013.01)

(58) Field of Classification Search
CPC ............. H01L 27/1214; H01L 27/1225; H01L 27/1288; H01L 27/3265; H01L 27/3262; H01L 28/40; H01L 29/7869
USPC ..................... 257/49–52, 59, 66, 72, E27.111, 257/E29.147, E29.151, E29.295, 748
See application file for complete search history.

(56) References Cited

U.S. PATENT DOCUMENTS

| 5,462,887 A | 10/1995 | Gluck |
| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 1801640 A | 6/2007 |

(Continued)

OTHER PUBLICATIONS

Kenji Nomura et al., "Thin Film Transistor Fabricated in Single-Crystalline Transparent Oxide Semiconductor", *Science*, May 23, 2003, vol. 300, pp. 1269-1272.

(Continued)

*Primary Examiner* — Ermias Woldegeorgis
(74) *Attorney, Agent, or Firm* — Nixon Peabody LLP; Jeffrey L. Costellia

(57) ABSTRACT

An object is to provide a semiconductor device with high aperture ratio or a manufacturing method thereof. Another object is to provide semiconductor device with low power consumption or a manufacturing method thereof. A light-transmitting conductive layer which functions as a gate electrode, a gate insulating film formed over the light-transmitting conductive layer, a semiconductor layer formed over the light-transmitting conductive layer which functions as the gate electrode with the gate insulating film interposed therebetween, and a light-transmitting conductive layer which is electrically connected to the semiconductor layer and functions as source and drain electrodes are included.

24 Claims, 19 Drawing Sheets

(51) Int. Cl.
*H01L 29/786* (2006.01)
*H01L 27/32* (2006.01)

(56) References Cited

U.S. PATENT DOCUMENTS

| | | | |
|---|---|---|---|
| 5,818,549 A * | 10/1998 | Maruyama et al. | 349/42 |
| 6,088,072 A * | 7/2000 | Lee | 349/39 |
| 6,294,274 B1 | 9/2001 | Kawazoe et al. | |
| 6,392,623 B1 * | 5/2002 | Shimada | 345/92 |
| 6,469,317 B1 | 10/2002 | Yamazaki et al. | |
| 6,563,174 B2 | 5/2003 | Kawasaki et al. | |
| 6,727,522 B1 | 4/2004 | Kawasaki et al. | |
| 6,737,306 B2 | 5/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,449,352 B2 | 11/2008 | Kim et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,737,517 B2 | 6/2010 | Kawamura et al. | |
| 7,738,048 B2 | 6/2010 | Yoshimoto | |
| 7,767,506 B2 | 8/2010 | Kim et al. | |
| 7,773,194 B2 | 8/2010 | Abe et al. | |
| 7,795,621 B2 | 9/2010 | Yamaguchi et al. | |
| 7,816,158 B2 | 10/2010 | Yoshimoto | |
| 7,821,613 B2 | 10/2010 | Kimura | |
| 7,868,326 B2 | 1/2011 | Sano et al. | |
| 7,964,871 B2 | 6/2011 | Iwasaki | |
| 8,149,346 B2 | 4/2012 | Kimura | |
| 8,153,339 B2 | 4/2012 | Kim et al. | |
| 8,168,974 B2 | 5/2012 | Sano et al. | |
| 8,212,953 B2 | 7/2012 | Hosoya | |
| 2001/0046027 A1 | 11/2001 | Tai et al. | |
| 2002/0056838 A1 | 5/2002 | Ogawa | |
| 2002/0131010 A1 | 9/2002 | Ozaki et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0173734 A1 * | 8/2005 | Yoshioka et al. | 257/202 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0102907 A1 * | 5/2006 | Lee et al. | 257/72 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0177269 A1 | 7/2010 | Kimura | |
| 2010/0224878 A1 | 9/2010 | Kimura | |
| 2011/0114947 A1 | 5/2011 | Iwasaki | |
| 2012/0170784 A1 | 7/2012 | Kimura | |
| 2012/0270348 A1 | 10/2012 | Hosoya | |

FOREIGN PATENT DOCUMENTS

| | | |
|---|---|---|
| EP | 1884821 A | 2/2008 |
| EP | 2 226 847 A2 | 9/2010 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 07-199227 A | 8/1995 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2006-173580 A | 6/2006 |
| JP | 2006-242987 A | 9/2006 |

(56) References Cited

FOREIGN PATENT DOCUMENTS

| | | |
|---|---|---|
| JP | 2007-073703 | 3/2007 |
| JP | 2007-081362 | 3/2007 |
| JP | 2007-123700 | 5/2007 |
| JP | 2007-133371 | 5/2007 |
| JP | 2007-199708 | 8/2007 |
| JP | 2007-266252 A | 10/2007 |
| JP | 2008-107794 A | 5/2008 |
| JP | 2009-099887 A | 5/2009 |
| TW | 200619830 | 6/2006 |
| TW | 200725901 | 7/2007 |
| TW | 200739226 | 10/2007 |
| TW | 200807124 | 2/2008 |
| WO | WO-2004/114391 A1 | 12/2004 |
| WO | WO-2006/051995 | 5/2006 |
| WO | WO-2006/093028 | 9/2006 |

OTHER PUBLICATIONS

Kenji Nomura et al., "Room-Temperature Fabrication of Transparent Flexible Thin-Film Transistors Using Amorphous Oxide Semiconductors", *Nature*, Nov. 25, 2004, vol. 432, pp. 488-492.

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-6352.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using sing-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch OVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Parks et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panuel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics Of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clarks.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vaccum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Ito.M et al., "Application of Transparent Amorphous Oxide TFT to Electronic Paper,", IDW '08 : Proceedings of the 15th International Display Workshops, Dec. 3, 2008, pp. 1617-1620.

Ikeda.N et al., "The Effect of Introducing Metal Bus Electrode into Fully Transparent TFT Array for Color Electronic Paper,", IDW '08 : Proceedings of the 15th International Display Workshops, Dec. 3, 2008, pp. 231-232.

* cited by examiner

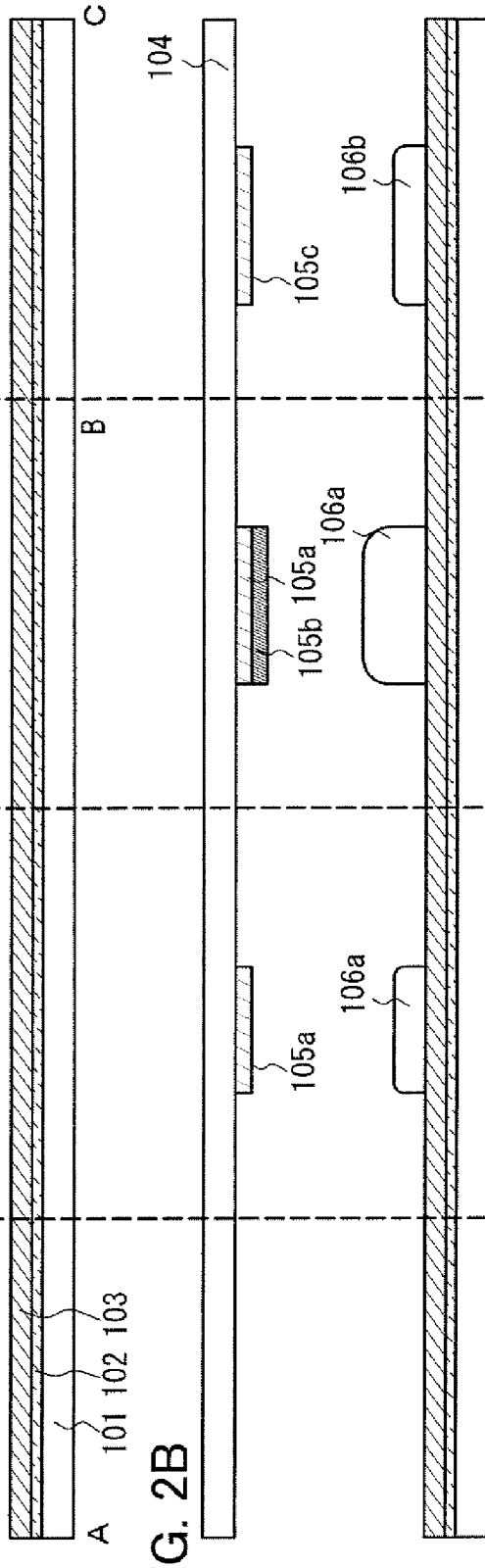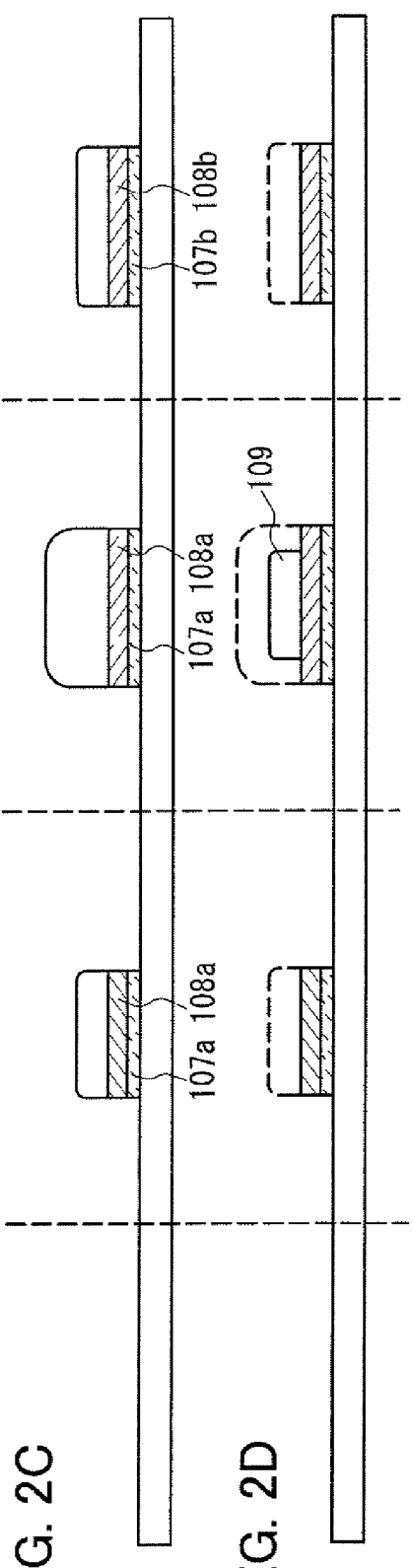

Transistor portion 302    Gate wiring portion 303

D  101 102 103  E 104
105a  105b
106a 107a 108a

109

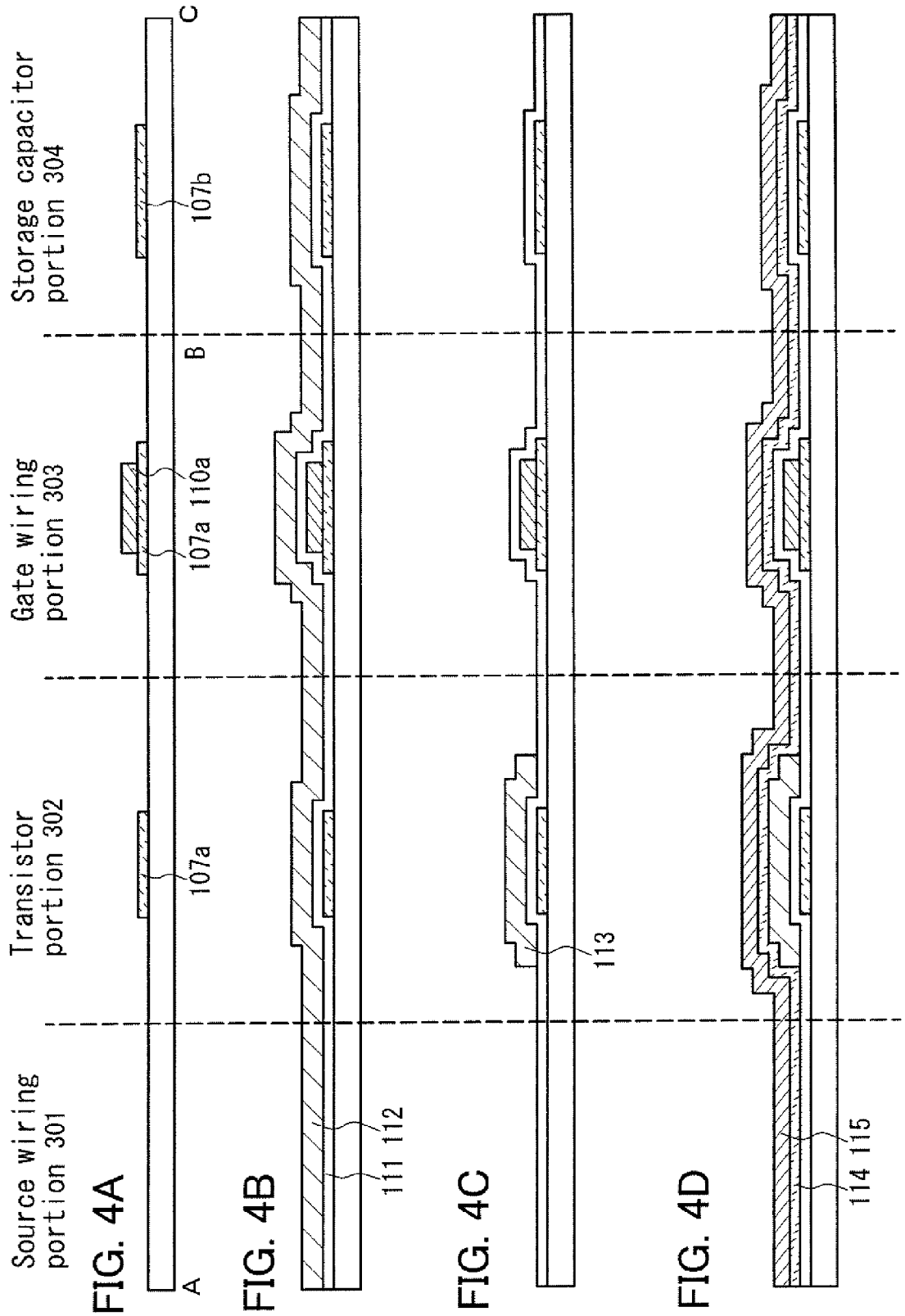

Transistor portion 302    Gate wiring portion 303

Transistor portion 302    Gate wiring portion 303

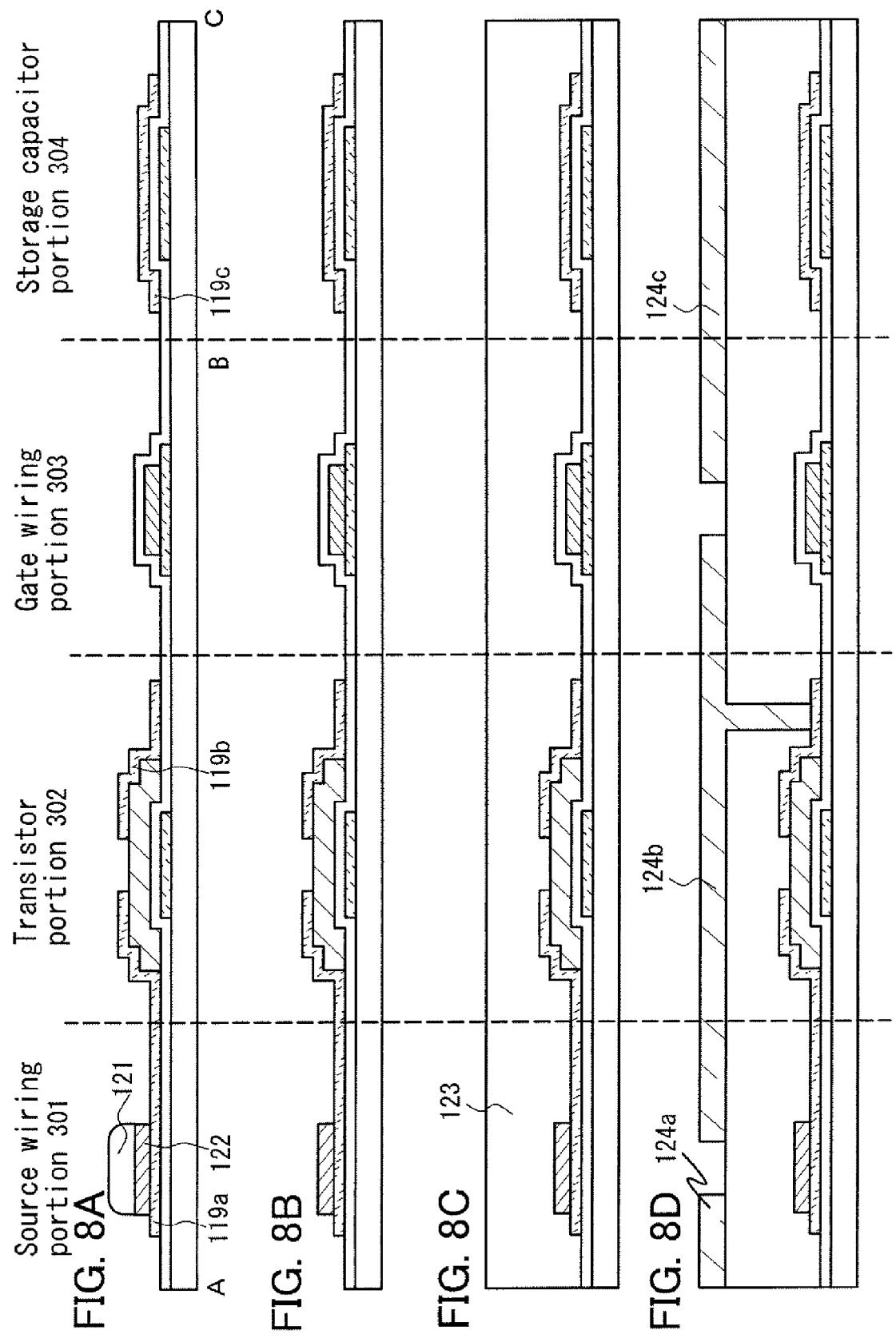

Transistor portion 302      Gate wiring portion 303

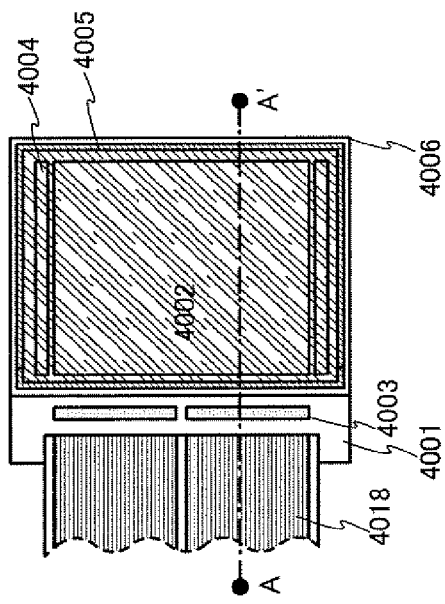
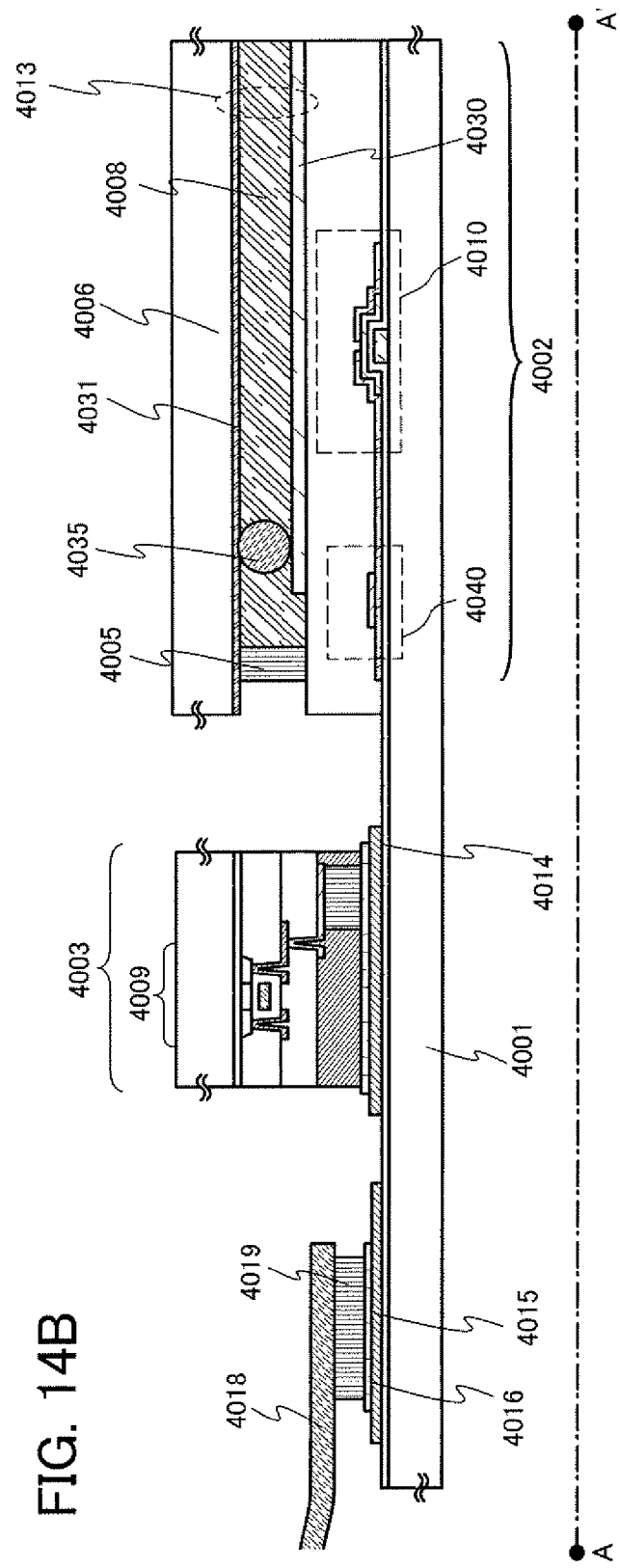
FIG. 14A
FIG. 14B

SEMICONDUCTOR DEVICE AND MANUFACTURING METHOD OF THE SAME

BACKGROUND OF THE INVENTION

1 Field of the Invention

This invention relates to a semiconductor device, a display device, a producing method thereof, or a method using the semiconductor device or the display device. In specific, this invention relates to a semiconductor device and a display device each including a light-transmitting semiconductor layer, a producing method thereof, or a method using the semiconductor device or the display device. Further in specific, this invention relates to a liquid crystal display device including a light-transmitting semiconductor layer, a manufacturing method thereof, or a method the liquid crystal display device.

2. Description of the Related Art

In recent years, flat panel displays such as liquid crystal displays (LCDs) arc becoming widespread. In specific, active-matrix LCDs provided with a transistor in each pixel are often used. As the transistor, the one which employs amorphous (non-crystalline) silicon or poly(polycrystalline) silicon for a semiconductor layer is widely used.

However, instead of the transistors formed using such silicon materials, transistors including light-transmitting semiconductor layers are considered. Further, a technique which increases an aperture ratio by employing light-transmitting electrodes as gate electrodes and source and drain electrodes is considered (see Reference 1 and Reference 2).

Reference 1: Japanese Published Patent Application No. 2007-123700

Reference 2: Japanese Published Patent Application No. 2007-81362

In general, a wiring for connecting elements such as transistors to each other is formed by extending conductive layers for forming a gate electrode and source and drain electrodes, whereby the wiring is formed in the same island as the conductive layers. Accordingly, a wiring for connecting gate of a transistor to gate of another transistor (such a wiring is called a gate wiring) is formed using the same layer structure and material as a gate electrode of the transistor; and a wiring for connecting source of the transistor to source of another transistor (such a wiring is called a source wiring) is formed using the same layer structure and material as a source electrode of the transistor, in many cases. Therefore, in the case where the gate electrode and the source and drain electrodes are formed using a light-transmitting material, the gate wiring and the source wiring are also formed using the light-transmitting material in many cases, like the gate electrode and the source and drain electrodes.

However, in general, as compared to a conductive material having light-shielding property and a reflecting property, such as aluminum (Al), molybdenum (Mo), titanium (Ti), tungsten (W), neodymium (Nd), Copper (Cu), or silver (Ag), a light-transmitting conductive material such as indium tin oxide (ITO), indium zinc oxide (IZO), or indium tin zinc oxide (ITZO) has low conductivity. Accordingly, if a wiring is formed using a light-transmitting conductive material, wiring resistance becomes high. For example, in the case where a large display device is manufactured, wiring resistance becomes very high because a wiring is long. As wiring resistance increases, the waveform of a signal which is transmitted through the wiring becomes distorted, resulting in a low voltage supply due to a voltage drop through the wiring resistance. Therefore, it is difficult to supply normal voltage and current, whereby normal display and operation become difficult.

On the other hand, in the case where a gate wiring and a source wiring are formed using a light-shielding conductive material by using the light-shielding conductive material for the gate electrode and the source and drain electrodes, distortion of the waveform of the signal can be suppressed due to an increase in the conductivity of the wiring. However, since a light-shielding material is used for the gate electrode and the source and drain electrodes, aperture ratio decreases and power consumption becomes high.

In addition, in terms of display performance, high storage capacitance and higher aperture ratio are demanded for pixels. Pixels each having high aperture ratio increase the use efficiency of light, so that power saving and miniaturization of a display device can be achieved. In recent years, the size of pixels has been miniaturized and images with higher definition are demanded. The miniaturization of the size of the pixel causes a decrease in the aperture ratio of the pixel because of large formation area for transistors and wirings which occupies one pixel. Accordingly, in order to obtain a high aperture ratio in each pixel in a regulation size, the circuit configuration of the pixel needs to have an efficient layout of necessary components.

In view of the foregoing problems, one object of an embodiment in this invention is to provide a semiconductor device with high aperture ratio and a manufacturing method thereof. In addition, one object of one embodiment in this invention is to provide a semiconductor device with low power consumption and a manufacturing method thereof.

In order to solve the above problem, one embodiment of this invention is a semiconductor device which includes a gate wiring including a gate electrode, in which a first conductive film and a second conductive film are stacked in this order, a gate insulating film covering the gate electrode and the gate wiring, an island-shaped semiconductor film provided over the gate electrode with the gate insulating film interposed therebetween, a source wiring including a source electrode, in which a third conductive film and a fourth conductive film are stacked in this order, an interlayer insulating film covering the island-shaped semiconductor film and the source wiring including the source electrode, a pixel electrode provided over the interlayer insulating film and electrically connected to the island-shaped semiconductor film, and a capacitor wiring. The gate electrode is formed of the first conductive film. The gate wiring is formed of the first conductive film and the second conductive film. The source electrode is formed of the third conductive film. The source wiring is formed of the third conductive film and the fourth conductive film.

Further, one embodiment in this invention is a semiconductor device which includes a plurality of gate wirings formed by being extended in a first direction, a plurality of source wirings extended in a second direction which intersects with the gate wirings, a plurality of pixel portions defined by the gate wiring and the source wiring, a gate electrode formed in each of the pixel portions and extended from the gate wiring, and a switching element including a source electrode extended from the source wiring. The gate wiring is formed of a first conductive film and a second conductive film thereover. The source wiring is formed of a third conductive film and a fourth conductive film thereover. The gate electrode is formed of the first conductive film. The source electrode is formed of the third conductive film.

Further, in one embodiment of this invention, the first conductive film and the third conductive film preferably have a light-transmitting property. Furthermore, in one embodiment of this invention, the second conductive film and the fourth conductive film preferably have a light-shielding property. Furthermore, in one embodiment of this invention, the second conductive film and the fourth conductive film have higher conductivity than the first conductive film and the third conductive film.

Further, in one embodiment of this invention, the second conductive film is formed of one or a plurality of elements selected from Al, Ti, Cu, Au, Ag, Mo, Ni, Ta, Zr, and Co. Furthermore, in one embodiment of this invention, the fourth conductive film is formed of one or a plurality of elements selected from Al, Ti, Cu, Au, Ag, Mo, Ni, Ta, Zr, and Co.

By employing such a structure, a light-transmitting transistor or a light-transmitting capacitor element can be formed. Therefore, even though the transistor or the capacitor element is provided in a pixel, a decrease in an aperture ratio can be suppressed. Further, since a wiring for connecting the transistor and an element (e.g., another transistor) or a wiring for connecting the capacitor element and an element (e.g., another capacitor element) is formed by using a material with low resistivity and high conductivity, the blunting of the waveform of a signal and a voltage drop due to wiring resistance can be suppressed.

Further, one embodiment of this invention is a semiconductor device in which the semiconductor film is any one of zinc oxide, titanium oxide, magnesium zinc oxide, cadmium zinc oxide, cadmium oxide, $InGaO_3(ZnO)_5$, and an In—Ga—Zn—O based amorphous oxide semiconductor.

Further, one embodiment of this invention is a manufacturing method of a semiconductor device, in which a first conductive film and a second conductive film are sequentially formed over a light-transmitting insulating substrate, a first resist mask having a portion where a stacked layer of the first conductive film and the second conductive film remain and a portion where only the first conductive film remains, whose thicknesses are different from each other is formed by photolithography with a multi-tone mask, the first conductive film and the second conductive film are etched by using the first resist mask, a second resist mask is formed by ashing the first resist mask, the second conductive film is etched by using the second resist mask and part of the first conductive film is exposed, a first insulating film is formed so as to cover the insulating substrate, the first conductive film, and the second conductive film, an island-shaped semiconductor film is formed over the first conductive film with the first insulating film interposed therebetween, a third conductive film and a fourth conductive film are sequentially formed over the insulating film, a third resist mask having a portion where a stacked layer of the third conductive film and the fourth conductive film remain and a portion where only the first conductive film remains, whose thicknesses are different from each other is formed by photolithography with a multi-tone mask, the third conductive film and the fourth conductive film are etched by using the third resist mask, a fourth resist mask is formed by ashing the third resist mask, and the fourth conductive film is formed by using the fourth resist mask and part of the third conductive film is exposed.

Further in the conductive layers, a light-transmitting region (a region with high light transmittance) and a light-shielding region (a region with low light transmittance) can be formed by one mask (reticle) with use of a multi-tone mask. Accordingly, the light-transmitting region (the region with high light transmittance) and the light-shielding region (the region with low light transmittance) can be formed without increasing the number of masks.

Note that semiconductor devices in this specification mean all devices which can function by utilizing semiconductor characteristics, and display devices, semiconductor circuits, and electronic devices are all semiconductor devices.

According to one embodiment of this invention, the light-transmitting transistor or the light-transmitting capacitor element can be formed. Therefore, even if the transistor or the capacitor is provided in a pixel, aperture ratio can be made high. Further, since a wiring for connecting the transistor and an element (e.g., another transistor) or a wiring for connecting a capacitor element and an element (e.g., another capacitor element) can be formed by using a material with low resistivity and high conductivity, the distortion of the waveform of a signal and a voltage drop due to wiring resistance can be reduced.

BRIEF DESCRIPTION OF THE DRAWINGS

In the accompanying drawings:

FIGS. 2A to 2D are cross-sectional views illustrating a manufacturing method of a semiconductor device of one embodiment in this invention;

FIGS. 4A to 4D are cross-sectional views illustrating the manufacturing method of the semiconductor device of one embodiment in this invention;

FIGS. 8A to 8D are cross-sectional views illustrating the manufacturing method of the semiconductor device of one embodiment in this invention;

FIG. 14A is a top view of a display device of one embodiment in this invention and FIG. 14B is a cross-sectional view of the display device of one embodiment in this invention;

DETAILED DESCRIPTION OF THE INVENTION

Figure 1A:
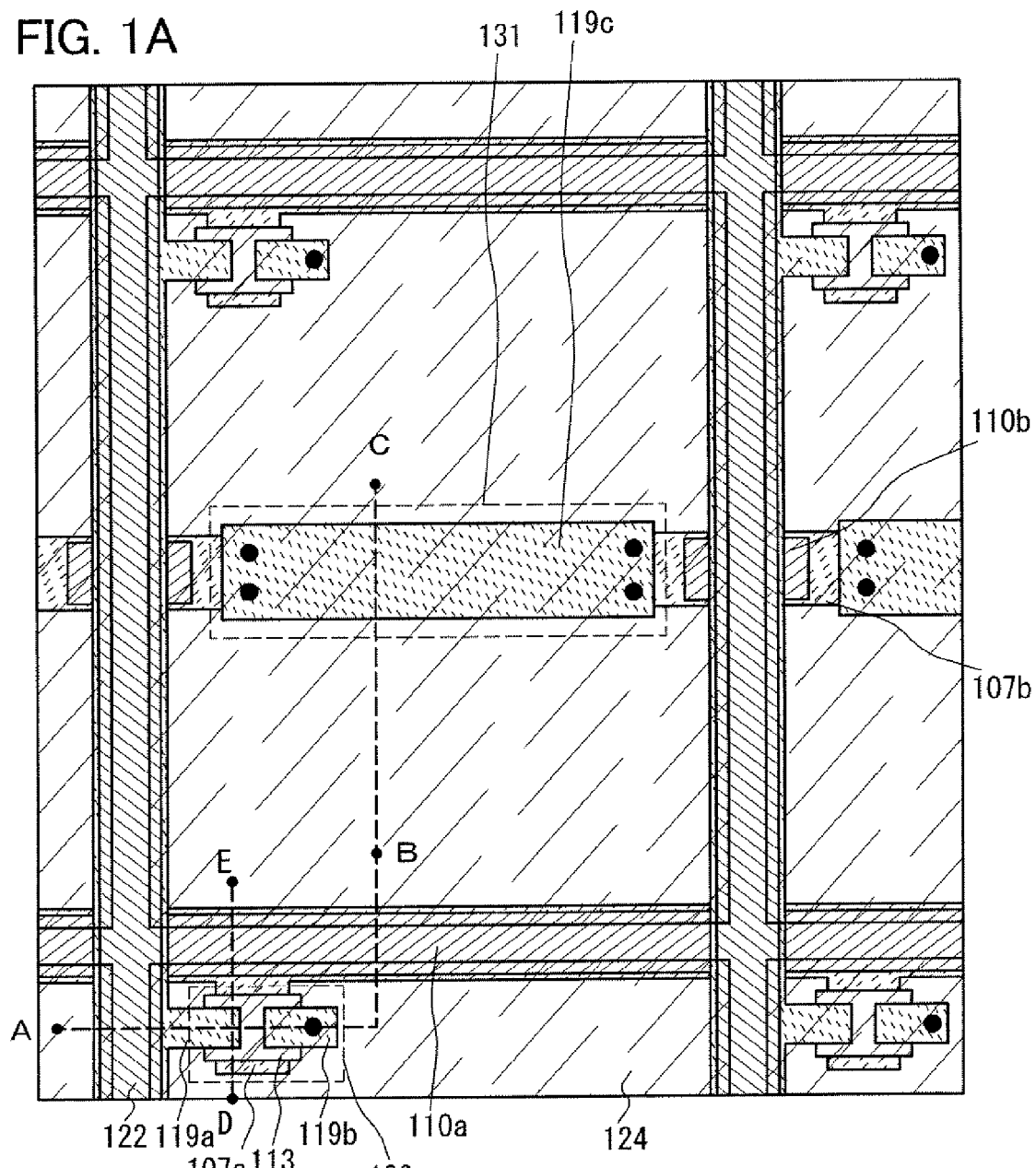
FIG. 1A is a top view of a semiconductor device according to one embodiment of this invention and FIG. 1B is a cross-sectional view of the semiconductor device of one embodiment in this invention.

Hereinafter, embodiments of this invention will be described with reference to drawings. However, this invention can be implemented in various forms and it is easily understood by those skilled in the art that embodiments and details disclosed herein can be variously changed without departing from the spirits and scope of this invention. Accordingly, this invention is not construed as being limited to the description of the following embodiments. Note that the same reference numeral is commonly used to denote the same component among the different drawings in the structure of this invention described below. Thus, detailed description of the same portions or portions having a similar function are omitted.

(Embodiment 1)

Figure 1B:
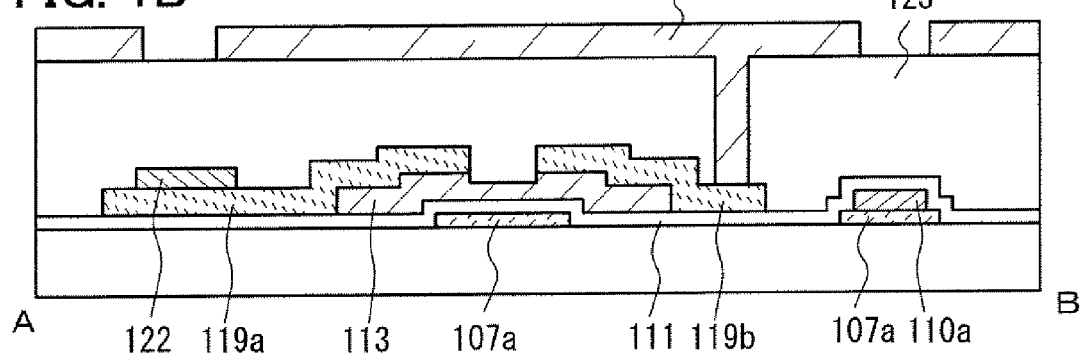

FIG. 1A is a top view illustrating one example of a semiconductor device of this embodiment and FIG. 1B is a cross-sectional view of FIG. 1A along line A-B.

As shown in FIG. 1A, an element substrate includes a pixel portion which has a gate wiring and a storage capacitor line provided in direction 1, a source wiring provided in direction 2 which intersects with the gate wiring and the storage capacitor line, and a transistor around a portion where the gate wiring and the source wiring intersect with each other.

In order to increase the aperture ratio of a pixel, a transistor of this embodiment includes a light-transmitting conductive layer which functions as a gate electrode, a gate insulating film formed over the light-transmitting conductive layer, a semiconductor layer formed over the light-transmitting conductive layer which functions as the gate electrode with the gate insulating film interposed therebetween, and light-transmitting conductive layers which function as source and drain electrodes electrically connected to the semiconductor layer.

In this manner, by forming the semiconductor layer and the electrode of the transistor by using a light-transmitting substance, the aperture ratio of the pixel can be increased. However, when the gate wiring electrically connected to the gate electrode and the source wiring electrically connected to the source and drain electrodes are formed by using a light-transmitting substance, wiring resistance increases, thereby causes an increase in power consumption. Therefore, the gate wiring and the source wiring are formed with a layered structure in which a light-transmitting conductive layer and a light-shielding conductive layer are stacked in this order. As the transistor, either one of a top-gate type and a bottom-gate type can be used.

The gate wiring electrically connected to the gate electrode of the transistor is formed by stacking a light-transmitting conductive layer 107a and a light-shielding conductive layer 110a in this order, and the source wiring electrically connected to the source or drain electrode of the transistor is formed by staking a light-transmitting conductive layer 119a and a light-shielding layer 122 in this order. In other words, the gate electrode of the transistor is formed using part of the light-transmitting conductive layer 107a which is included in the gate wiring, and the source and drain electrodes are formed using part of the light-transmitting conductive layer 119a which is included in the source wiring.

By stacking the light-transmitting conductive layer and the light-shielding conductive layer in this order to form the gate wiring and the source wiring, wiring resistance and power consumption can be reduced. In addition, since the gate wiring and the source wiring are each formed using the light-shielding conductive layer, a space between pixels can be shielded from light. That is, with the gate wiring provided in a row direction and the source wiring provided in column direction, the space between the pixels can be shielded from light without using a black matrix.

Figure 17A:
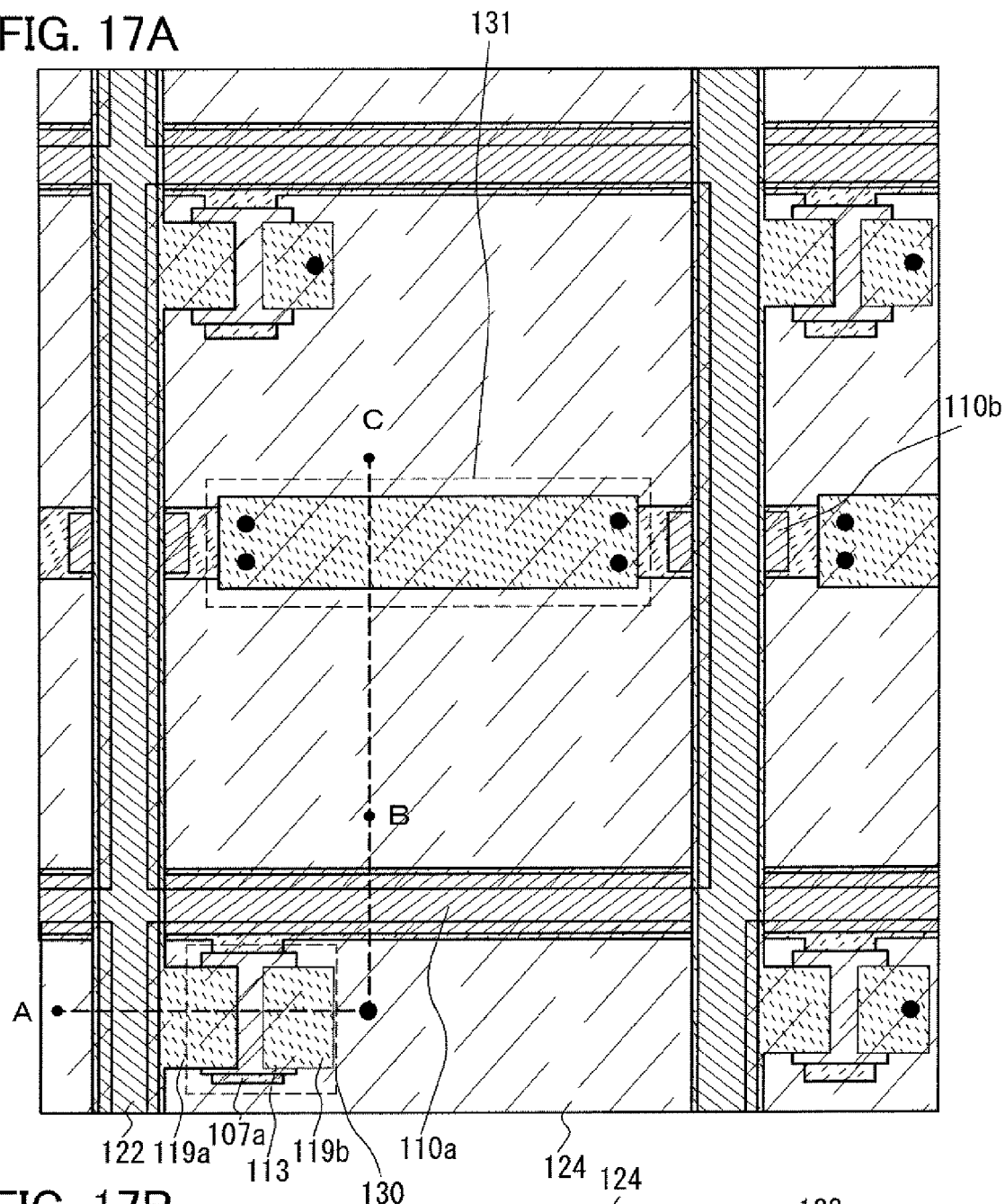
FIG. 17A is a top view of a semiconductor device of one embodiment in this invention and FIG. 17B is a cross-sectional view of the semiconductor device of one embodiment in this invention.
Figure 17B:
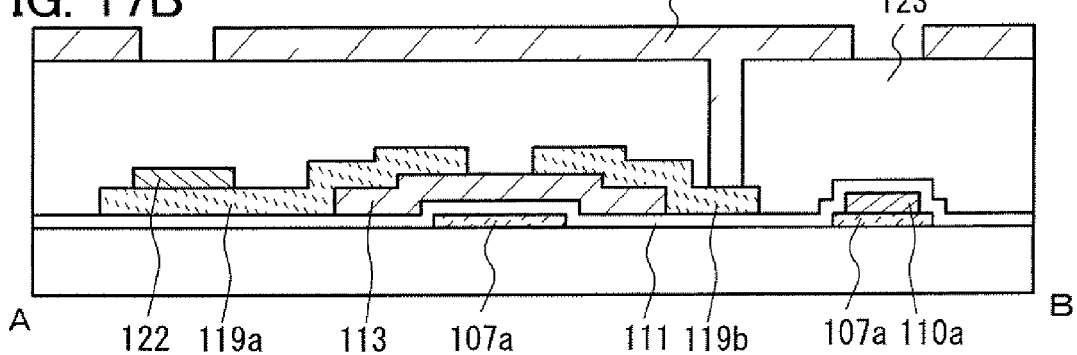

In the case where the transistor is formed over the gate wiring, the size of the transistor depends on the width of the gate wiring of the transistor. However, in this embodiment, since the transistor is formed in a pixel, the size of the transistor can be large. As shown in FIGS. 17A and 17B, the transistor which is larger than the width of the gate wiring can be formed. By forming a large transistor, its electric performance can be adequately high, and a writing time of a signal to the pixel can be shortened. Accordingly, a display device with high definition can be provided.

In addition, the storage capacitor line provided in the direction 1 which is the same as that of the gate wiring is formed by stacking a light-transmitting conductive layer and a light-shielding conductive layer in this order like the gate wiring. A storage capacitor portion is formed in the storage capacitor line. The storage capacitor portion includes a light-transmitting conductive layer which functions as a lower electrode and a light-transmitting conductive layer which functions as an upper electrode, by using an insulating film serving as a gate insulating film as a dielectrics.

In this manner, by forming the storage capacitor portion with the light-transmitting conductive layer, aperture ratio can be increased. In addition, by forming the storage capacitor portion with the light-transmitting conductive layer, the storage capacitor portion can be large, so that the potential of a pixel electrode can be easily held even when the transistor is turned off. Moreover, feedthrough potential can be low.

Moreover, the number of masks necessary for forming an element substrate having the pixel configuration shown in FIGS. 1A and 1B can be 5. That is, a first mask is used for forming the gate wiring and the capacitor wiring, a second mask is for forming a semiconductor layer 113, a third mask is for forming the source wiring and the upper electrode of the storage capacitor portion, a fourth mask is for forming contact holes which reach the source wiring and the upper electrode of the storage capacitor portion and a fifth mask is for forming a pixel electrode 124.

In this manner, in the case of the pixel configuration shown in FIGS. 1A and 1B, a display device with high aperture ratio can be achieved with the small number of masks.

Next, one example of a manufacturing process of a semiconductor device of this embodiment is shown with reference to cross-sectional views in FIGS. 2A to 2D, FIGS. 3A to 3D, FIGS. 4A to 4D, FIGS. 5A to 5D, FIGS. 6A to 6C, FIGS. 7A to 7C, FIGS. 8A to 8D, and FIGS. 9A to 9D. Although a case where a multi-tone mask is used is described with reference to FIGS. 2A to 2D, FIGS. 3A to 3D, FIGS. 4A to 4D, FIGS. 5A to 5D, FIGS. 6A to 6C, FIGS. 7A to 7C, FIGS. 8A to 8D, and FIGS. 9A to 9D, this embodiment is not limited thereto. Note that FIGS. 2A to 2D, FIGS. 4A to 4D, FIGS. 6A to 6C, and FIGS. 8A to 8D are cross-sectional views of FIG. 1A along line A-C, and FIGS. 3A to 3D, FIGS. 5A to 5D, FIGS. 7A to 7C, and FIGS. 9A to 9D are cross-sectional views of FIG. 1A along line D-E. FIGS. 2A to 2D, FIGS. 4A to 4D, FIGS. 6A to 6C, and FIGS. 8A to 8D correspond to FIGS. 3A to 3D, FIGS. 5A to 5D, FIGS. 7A to 7C, and FIGS. 9A to 9D, respectively. Note that FIGS. 2A to 2D, FIGS. 4A to 4D, and FIGS. 6A to 6C illustrate a source wiring portion 301, a transistor portion 302, a gate wiring portion 303, and a storage capacitor portion 304, and FIGS. 3A to 3D, FIGS. 5A to 5D, FIGS. 7A to 7C illustrate the transistor portion 302 and the gate wiring portion 303.

Figure 3A:
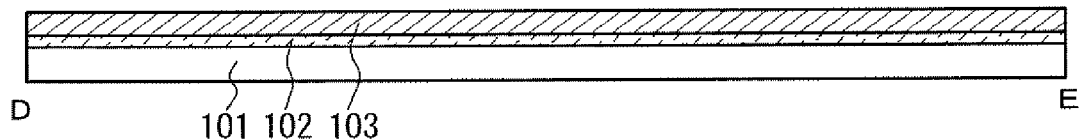
FIGS. 3A to 3D are cross-sectional views illustrating the manufacturing method of the semiconductor device of one embodiment in this invention.

First, as shown in FIG. 2A and FIG. 3A, a conductive film 102 and a conductive film 103 are stacked over a substrate 101 by sputtering. These steps are consecutively performed, and further sputtering can be consecutively performed by using a multi-chamber. By consecutively forming the conductive film 102 and the conductive film 103, throughput is increased and contamination by an impurity or dust can be suppressed.

The substrate 101 is preferably formed using a material having high light transmittance. For example, a glass substrate, a plastic substrate, an acrylic substrate, a ceramic substrate, or the like can be used.

It is preferable that the light transmittance of the conductive film 102 be sufficiently high. Moreover, the light transmittance of the conductive film 102 is preferably higher than that of the conductive film 103.

As the conductive film 102, indium tin oxide (ITO), indium tin oxide containing silicon oxide (ITSO), organic indium, organic tin, zinc oxide, titanium nitride, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. Such a material can be used to form the conductive film 102 with a single-layer structure or a layered structure by sputtering. However, in the case of the layered structure, the light transmittance of each of a plurality of films is preferably high enough.

The resistivity of the conductive film 103 is preferably low enough and the conductivity of the conductive film 103 is preferably high enough. In addition, the resistivity of the conductive film 102 is preferably lower than that of the conductive film 103. However, since the conductive film 102 functions as a conductive layer, the resistivity of the conductive film 102 is preferably lower than that of an insulating layer.

The conductive film 103 can be formed to have a single-layer structure or a layered structure using a metal material such as molybdenum, titanium, chromium, tantalum, tungsten, aluminum, copper, neodymium, or scandium, or an alloy material containing the above material as its main component, by sputtering or vacuum evaporation. In addition, in the case where the conductive film 103 is formed to have a layered structure, a light-transmitting conductive film may be included in the plurality of films.

Note that when the conductive film 103 is formed over the conductive film 102, both of the films react with each other in some cases. For example, when the top surface (a surface which is in contact with the conductive film 103) of the conductive film 102 is formed using ITO and the bottom surface (a surface which is in contact with the conductive film 102) of the conductive film 103 is formed using aluminum, a chemical reaction occurs therebetween. Accordingly, in order to avoid the chemical reaction, a material with a high melting point is preferably used for the bottom surface (the surface which is in contact with the conductive film 102) of the conductive film 103. For example, as the material with a high melting point, molybdenum (Mo), titanium (Ti), tungsten (W), neodymium (Nd), or the like can be given. Also, it is preferable to form the conductive film 103 into a multi-layer film by using a material with high conductivity over a film formed using the material with the high melting point. As the material with high conductivity, aluminum (Al), copper (Cu), silver (Ag), or the like can be given. For example, in the case where the conductive film 103 is formed to have a layered structure, a stacked layer of molybdenum (Mo) as a first layer, aluminum (Al) as a second layer, and molybdenum (Mo) as a third layer, or a stacked layer of molybdenum (Mo) as a first layer, aluminum (Al) containing a small amount of neodymium (Nd) as a second layer, and molybdenum (Mo) as a third layer can be used.

Since the conductive film 102 is formed under the conductive film 103 in the structure of this embodiment, only the conductive film 103 can be formed using commercial glass provided with ITO (indium tin oxide) by sputtering.

Although not shown, note that silicon oxide, silicon nitride, silicon oxynitride, or the like can be formed as a base film between the substrate 101 and the conductive film 102. By forming the base film between the substrate 101 and the light-transmitting conductive film, diffusing of mobile ions, impurities, or the like from the substrate 101 into an element can be suppressed, whereby the deterioration in the characteristic of the element can be prevented.

Figure 3B:
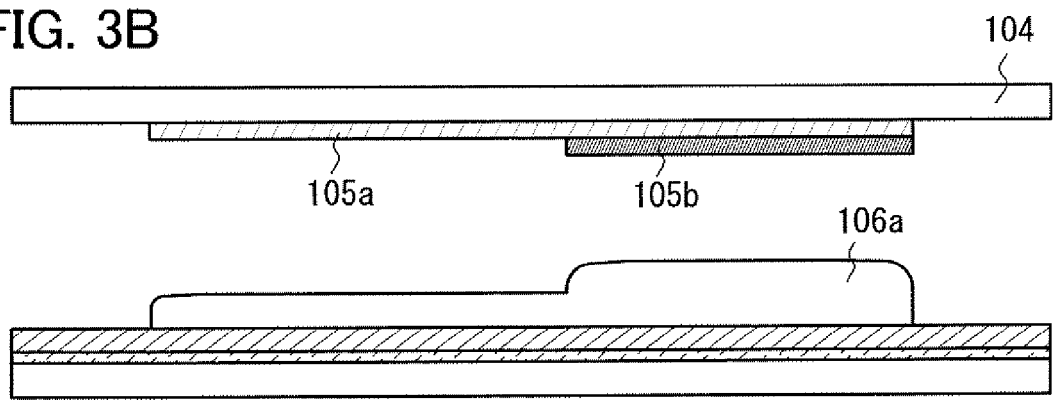

Next, as shown in FIG. 2B and FIG. 3B, resist masks 106a and 106b are formed over the conductive film 103. The resist masks 106a and 106b can be formed to have regions with different thicknesses by using a multi-tone mask. By using the multi-tone mask, the number of photomasks used and the number of manufacturing steps can be reduced, which is preferable. In this embodiment, a multi-tone mask can be used in a step for forming the pattern of the conductive film 102 and the conductive film 103 and a step for forming the light-transmitting conductive layer which functions as the gate electrode.

The multi-tone mask is a mask with which exposure can be performed with the amount of light in a plurality of levels. Typically, exposure is performed with the amount of light in three levels: an exposure region, a half-exposure region, and a non-exposure region. By using the multi-tone mask, a resist mask with a plurality of thicknesses (typically two thicknesses) can be formed through one exposure step and one development step. Thus, the number of photomasks can be reduced by using the multi-tone mask.

Figures 1, 13A:
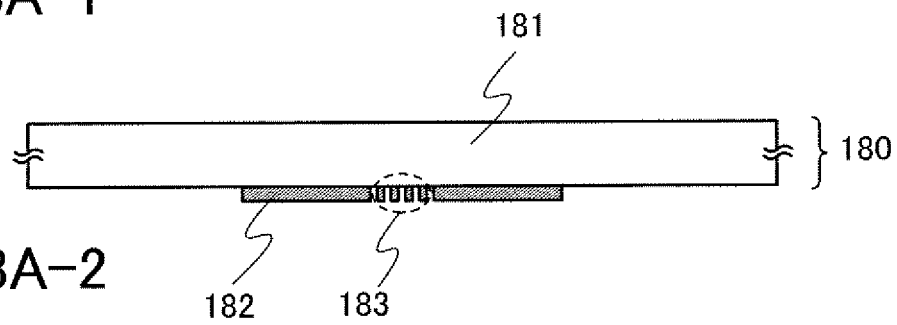
FIGS. 13A-1, 13A-2, 13B-1, and 13B-2 are diagrams for illustrating a multi-tone mask which can be applied to one embodiment in this invention.
Figures 2, 13A:
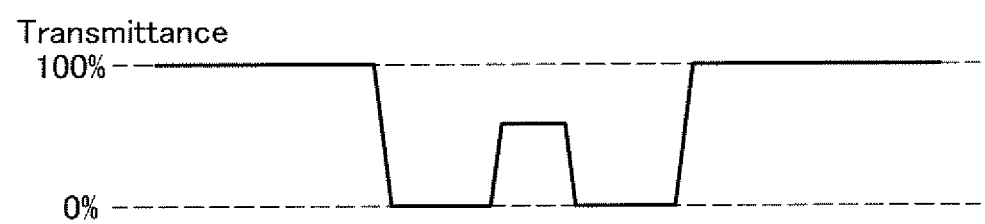
Figures 1, 13B:
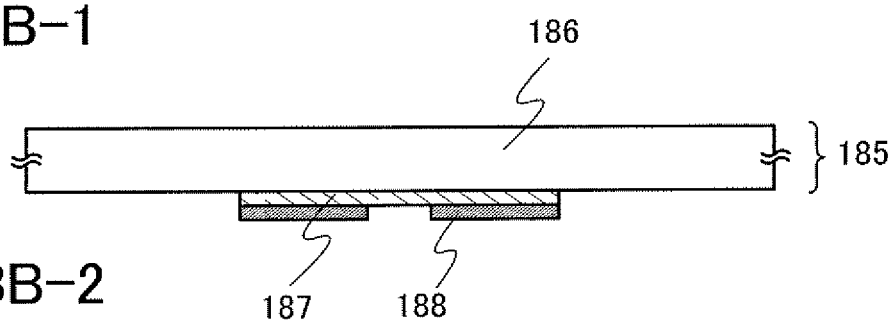
Figures 2, 13B:
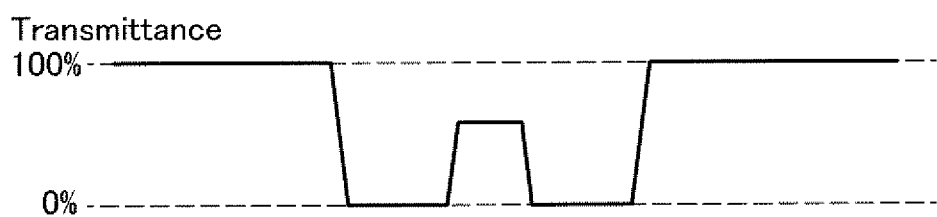

FIGS. 13A-1 and 13B-1 are cross-sectional views of typical multi-tone masks. FIG. 13A-1 shows a gray-tone mask 180 and FIG. 13B-1 shows a half-tone mask 185.

The gray-tone mask 180 shown in FIG. 13A-1 includes a light-shielding portion 182 formed using a light-shielding layer on a light-transmitting substrate 181 and a diffraction grating portion 183 formed by the pattern of the light-shielding layer.

The diffraction grating portion 183 controls the amount of transmitted light by using slits, dots, meshes, or the like provided in intervals which are equal to or smaller than the limit of the resolution of light used for exposure. Note that the slits, dots, or meshes may be provided in the diffraction grating portion 183 in periodic intervals or non-periodic intervals.

As the light-transmitting substrate 181, quartz or the like can be used. The light-shielding layer included in the light-shielding portion 182 and the diffraction grating portion 183 may be formed using a metal film: preferably chromium, chromium oxide, or the like.

When the gray-tone mask 180 is irradiated with light for exposure, the transmittance of a region which overlaps with the light-shielding portion 182 is 0% as shown in FIG. 13A-2 and the transmittance of a region which is not provided with the light-shielding portion 182 or the diffraction grating portion 183 is 100%. In addition, the transmittance of the diffraction grating portion 183 is approximately 10 to 70% and can be adjusted by intervals between slits, dots or meshes in the diffraction grating, or the like.

The halftone mask 185 shown in FIG. 13B-1 includes a semi-light-transmitting portion 187 and a light-shielding portion 188 which are formed using a semi-light-transmitting layer and a light-shielding layer, respectively, over a light-transmitting substrate 186.

The semi-light-transmitting portion 187 can be formed by using a layer of MoSiN, MoSi, MoSiO, MoSiON, CrSi, or the like. The light-shielding portion 188 may be provided by using the same metal film as the light-shielding layer for the gray-tone mask, preferably, such as chromium or chromium oxide.

When the half-tone mask 185 is irradiated with light for exposure, the transmittance of a region which overlaps with the light-shielding portion 188 is 0% as shown in FIG. 13B-2 and the transmittance of a region which is not provided with the light-shielding portion 188 or the semi-light-transmitting portion 187 is 100%. In addition, the transmittance of the semi-light-transmitting portion 187 is approximately 10 to 70% and can be adjusted by the kind of material used or the thickness of a film to be formed, or the like.

By performing exposure and development with the use of the multi-tone mask, the resist mask having the regions with different thicknesses can be formed. In addition, the resist mask with different thicknesses can be formed.

As shown in FIG. 2B and FIG. 3B, a half-tone mask includes semi-light-transmitting layers 105a and 105c and a light-shielding layer 105b on a light-transmitting substrate 104. Accordingly, a portion which is to be the bottom electrode of the storage capacitor portion and a portion which is to be the gate electrode are provided with a region with a small thickness of the resist mask 106a and the thin resist mask 106b, and a portion which is to be the gate wiring is provided with a region with a large thickness of the resist mask 106a over the conductive film 103.

Figure 3C:
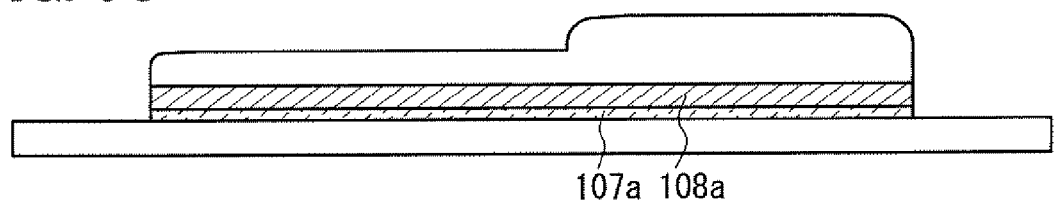

Next, as shown in FIG. 2C and FIG. 3C, the conductive films 102 and 103 are etched by using the resist masks 106a and 106b. By the etching, conductive layers 107a, 108a, 107b, and 108b can be formed.

Figure 3D:
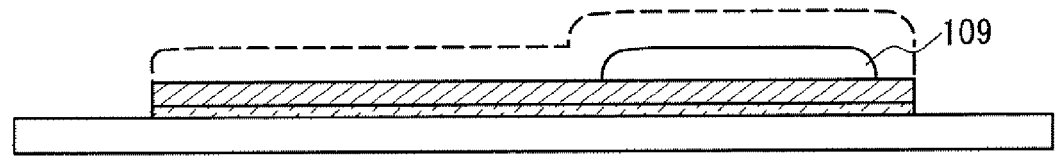

Next, as shown in FIG. 2D, and FIG. 3D, the resist masks 106a and 106b are ashed by an oxygen plasma. By ashing the resist masks 106a and 106b by the oxygen plasma, the region with the small thickness of the resist mask 106a is removed and the light-shielding conductive layer under the resist mask 106a is exposed. In addition, the region with a large thickness of resist mask 106a becomes small and remains as a resist mask 109. In this manner, by using the resist mask formed using the multi-tone mask, a resist mask is not additionally used, so that steps can be simplified.

Next, the light-shielding conductive layer 108a is etched by using the resist mask 109. As a result, part of the conductive layer 108a is removed and the conductive layer 107a is exposed. In addition, the conductive layer 108a except a portion on which the resist mask 109 is formed is removed. This is because the part of the conductive layer 108a is exposed due to the reduction of the resist mask 106a in size by the ashing treatment. Accordingly, the part of the conductive layer 108a, which is not covered with the resist mask 109 is etched at the same time. Thus, the areas of the conductive layer 108a and the conductive layer 107a are largely different from each other. In other words, the area of the conductive layer 107a is larger than that of the conductive layer 108a. Alternatively, the conductive layers 108a and 107a include a region in which the conductive layers 108a and 107a overlap with each other, and a region in which the conductive layers 108a and 107a do not overlap with each other.

When the light-shielding conductive layer is removed, part of the light-transmitting conductive layer (for example, a surface portion which is in contact with the light-shielding conductive layer) is also removed in some cases. The selectivity of the light-shielding conductive layer to the light-transmitting conductive layer in etching determines how much the light-transmitting conductive layer is removed. Therefore, for example, the thickness of the conductive layer 107a in a region covered with the conductive layer 110a is larger than that of the conductive layer 107a in a region which is not covered with the conductive layer 110a in many cases.

In the case where only the light-shielding conductive layer is removed by wet etching while the light-transmitting conductive layer is left, an etching solution with high selectivity of the light-shielding conductive layer to the light-transmitting conductive layer is used. In the case where a stacked layer of molybdenum (Mo) as a first layer, aluminum (Al) as a second layer, and molybdenum (Mo) as a third layer, or a stacked layer of molybdenum (Mo) as a first layer, aluminum (Al) containing a small amount of neodymium (Nd) as a second layer, and molybdenum (Mo) as a third layer is used as the light-shielding conductive layer, for example, a mixed acid of phosphoric acid, nitric acid, acetic acid, and water can be used for the wet etching. With the use of this mixed acid, a forward tapered shape which is uniform and favorable can be obtained. In this manner, in addition to an improvement in coverage due to a tapered shape, high throughput can be obtained while the wet etching is a simple process in which an etching by an etchant, a rinse by pure water, and drying are performed. Thus, wet etching is suitable for etching of the above light-shielding conductive layer.

Figure 5A:
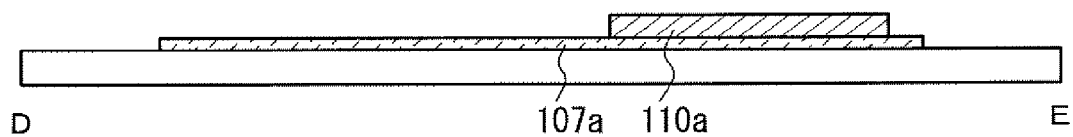
FIGS. 5A to 5D are cross-sectional views illustrating the manufacturing method of the semiconductor device of one embodiment in this invention.

Next, the resist mask 109 is removed as shown in FIG. 4A and FIG. 5A.

Part of a region in the conductive layers 110a and 107a (a region mainly including the conductive layer 110a) can function as the gate wiring or part of the gate wiring while another part of the region (a region mainly including only the conductive layer 107a) can function as the gate electrode or part of the gate electrode of the transistor. It is preferable that a region in which the conductive layers 110a and 107a overlap with each other function as the gate wiring or the part of the gate wiring because the region includes the conductive layer 110a which has high conductivity in many cases. Alternatively, it is preferable that the conductive layer 107a in the region which does not include the conductive layer 110a function as the gate electrode or the part of the gate electrode of the transistor because the region can transmit light in some cases.

Accordingly, in the conductive layers 110a and 107a, a wiring which functions as the gate electrode, may be considered to be connected to a wiring which functions as the gate wiring (or at least one of the conductive layers 110a and 107a which functions as the gate wiring). Alternatively, at least one of the conductive layers 110a and 107a included in the gate wiring may be formed to have a larger area than the other layer included in the gate wiring; part of the region with the larger area can be considered to function as the gate electrode. Alternatively, the conductive layer 107a may be formed to have a larger area than the conductive layer 110a; part of the region with the larger area can be considered to function as the gate electrode. That is, the part of the gate wiring can be considered to function as the gate electrode or the part of the gate electrode. Alternatively, the conductive layer 110a that mainly functions as the gate wiring or the part of the gate wiring can be considered to be formed over the conductive layer 107a that mainly functions as the gate electrode or the part of the gate electrode.

Similarly, part of a region in the light-shielding conductive layer and the conductive layer 107b (a region mainly including the conductive layer 110b) can function as the capacitor wiring or part of the capacitor wiring, and another part of the region (a region mainly including only the conductive layer 107b) can function as an electrode of a capacitor element or part of the electrode of the capacitor element. It is preferable that a region in which the light-shielding conductive layer and the conductive layer 107b overlap with each other function as the capacitor wiring or the part of the capacitor wiring because the region includes the light-shielding conductive layer which has high conductivity in many cases. Alternatively, it is preferable that the conductive layer 107b in the region which does not include the light-shielding conductive layer function as the electrode of the capacitor element or the part of the electrode of the capacitor element because the region can transmit light in some cases.

Accordingly, in the light-shielding conductive layer and the conductive layer 107b, a wiring which functions as the electrode of the capacitor element, may be considered to be connected to a wiring which functions as the capacitor element (or at least one of the light-shielding conductive layer and the conductive layer 107b which functions as the capacitor wiring). Alternatively, at least one of the light-shielding conductive layer and the conductive layer 107b included in the capacitor wiring may be formed to have a larger area than the other layer included in the capacitor wiring; part of the region with the larger area can be considered to function as the electrode of the capacitor element. Alternatively, the conductive layer 107b may be formed to have a larger area than the light-shielding conductive layer; part of the region with the larger area can be considered to function as the electrode of the capacitor element. That is, the part of the capacitor wiring can be considered to function as the electrode of the capacitor element or the part of the electrode of the capacitor element. Alternatively, the conductive layer 110b that mainly functions as the capacitor wiring or the part of the capacitor wiring can be considered to be formed over the conductive layer 107b that mainly functions as the electrode of the capacitor element or the part of the electrode of the capacitor element.

Figure 5B:
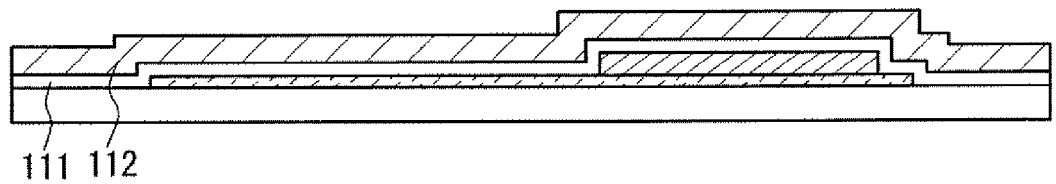

Next, as shown in FIG. 4B and FIG. 5B, an insulating film 111 which functions as a gate insulating film is formed so as to cover the light-transmitting conductive layer and the light-shielding conductive layer. After that, a semiconductor film 112 is formed over the insulating film 111.

The insulating film 111 may be formed to have a single-layer structure or a layered structure including a plurality of films. In the case of the layered structure including a plurality of films, it is preferable that all of the films have sufficiently high transmittance. Similarly, the semiconductor film 112 may be formed to have a single-layer structure or a layered structure including a plurality of films. In the case of the layered structure including a plurality of films, it is preferable that all of the films have sufficiently high transmittance.

The insulating film 111 which covers the light-transmitting conductive layer and the light-shielding conductive layer is formed to a thickness of 50 to 500 nm. The insulating film 111 may be formed to have a single-layer structure of a film containing an oxide of silicon or a nitride of silicon, or as a layered structure thereof, by a sputtering method or a variety of CVD methods such as a plasma CVD method. Specifically, a film containing silicon oxide (SiOx), a film containing silicon oxynitride (SiOxNy), or a film containing silicon nitride oxide (SiNxOy) is formed as a single-layer structure, or these films are appropriately stacked to form the insulating film 111.

The insulating film may be formed by oxidizing or nitriding the surface of the light-transmitting conductive layer or the light-shielding conductive layer through a high density plasma treatment in an atmosphere containing oxygen, nitrogen, or oxygen and nitrogen. The insulating film formed through a high density plasma treatment has excellent uniformity in its film thickness, film quality, and the like and the film can be formed to be dense. As an atmosphere containing oxygen, a mixed gas of oxygen ($O_2$), nitrogen dioxide ($NO_2$) or dinitrogen monoxide ($N_2O$), and a rare gas; or a mixed gas of oxygen ($O_2$), nitrogen dioxide ($NO_2$) or dinitrogen monoxide ($N_2O$), a rare gas, and hydrogen ($H_2$); can be used. As an atmosphere containing nitrogen, a mixed gas of nitrogen ($N_2$) or ammonia ($NH_3$) and a rare gas, or a mixed gas of nitrogen ($N_2$) or ammonia ($NH_3$), a rare gas, and hydrogen ($H_2$) can be used. The surfaces of the light-transmitting conductive layer and the light-shielding conductive layer can be oxidized or nitrided by oxygen radicals (including OH radicals in some cases) or nitrogen radicals (including NH radicals in some cases) generated by high density plasma.

In the case where the insulating film 111 is formed by the high density plasma treatment, the insulating film 111 is formed so as to have a thickness of 1 to 20 nm, typically 5 to 10 nm, and cover the light-transmitting conductive layer and the light-shielding conductive layer. Since the reaction which occurs in this case is a solid-phase reaction, an interface state density between the insulating film 111 and the light-transmitting conductive layer and the light-shielding conductive layer can be extremely low. Since the light-transmitting conductive layer and the light-shielding conductive layer are directly oxidized or nitrided, the thickness of the formed insulating film 111 may be uniform. Consequently, by solid-phase oxidation of the surface of the electrode by the high density plasma treatment shown here, an insulating film with favorable uniformity and low interface state density can be formed. Here, an oxide of an element selected from tantalum (Ta), tungsten (W), titanium (Ti), molybdenum (Mo), chromium (Cr), niobium (Nb), or the like; or an oxide of an alloy material or a compound material mainly containing the element functions as the insulating film 111.

For the insulating film 111, just an insulating film formed by the high density plasma treatment may be used, or at least one insulating film of silicon oxide, silicon nitride containing oxygen, silicon oxide containing nitrogen, or the like may be additionally stacked over the insulating film by a CVD method utilizing plasma or heat reaction. Either way, transistors in each of which a gate insulating film is partly or entirely an insulating film formed by the high density plasma can be made to have little variations in characteristic.

The insulating film 111 may use the following which have favorable compatibility with the oxide semiconductor film: alumina ($Al_2O_3$), aluminum nitride (AlN), titanium oxide ($TiO_2$), zirconia ($ZrO_2$), lithium oxide ($Li_2O$), potassium oxide ($K_2O$), sodium oxide ($Na_2O$), indium oxide ($In_2O_3$), yttrium oxide ($Y_2O_3$), or calcium zirconate ($CaZrO_3$); or a material including at least two thereof. The gate insulating film 111 may be formed as a single layer or as stacked layers of two or more layers.

The insulating film 111 is preferably formed using a light-transmitting material or a material with high light transmittance. Also, the conductive layer 107a, the conductive layer 107b, or the semiconductor film 112 are preferably formed using a light-transmitting material or a material with high light transmittance. Therefore, comparing their light transmittance, it is preferable that the insulating film 111 have higher light transmittance than or approximately the same transmittance as the conductive layer 107a, the conductive layer 107b, or the semiconductor film 112. This is because the insulating film 111 is formed to have a large area in some cases and higher transmittance is preferable in order to increase the use efficiency of light.

Since the insulating film 111 preferably functions as an insulator, the insulating film 111 preferably has a resistivity that is appropriate for the insulator. On the other hand, the conductive layers 107a and 107b preferably function as conductors, and the semiconductor film 112 preferably functions as a semiconductor. Therefore, the insulating film 111 preferably has higher resistivity than the conductive layer 107a, the conductive layer 107b, the conductive layers 110a and 110b, and the semiconductor film 112. The insulating film 111 with a high resistivity is preferable because the conductors can be electrically insulated from each other, whereby the leakage of current can be suppressed and a circuit can operate with higher performance.

Next, the semiconductor film 112 is formed over the insulating film 111. The semiconductor film 112 is preferably formed using a light-transmitting material or a material with high light transmittance. The semiconductor film 112 can be formed by using an oxide semiconductor. For the oxide semiconductor, zinc oxide (ZnO) in an amorphous state, a polycrystalline state, or a microcrystalline state in which both amorphous and polycrystalline states exist, to which one type or a plurality of types of impurity elements selected from the following is added can be used: a Group 1 element (for example, lithium (Li), sodium (Na), kalium (K), rubidium (Rb), or cesium (Cs)), a Group 13 element (for example, boron (B), gallium (Ga), indium (In), or thallium (Tl)), a Group 14 element (for example, carbon (C), silicon (Si), germanium (Ge), tin (Sn), or lead (Pb)), a Group 15 element (for example, nitrogen (N), phosphorus (P), arsenic (As), antimony (Sb), or bismuth (Bi)), a Group 17 element (for example, fluorine (F), chlorine (Cl), bromine (Br), or iodine (I)), or the like. Alternatively, zinc oxide (ZnO) in an amorphous state, a polycrystalline state, or a microcrystalline state in which both amorphous and polycrystalline states exist to which any impurity element is not added can also be used. Further, any of the following can also be used: $InGaO_3(ZnO)_5$, magnesium zinc oxide ($Mg_xZn_{1-x}O$), cadmium zinc oxide ($Cd_xZn_{1-x}O$), cadmium oxide (CdO), or an In—Ga—Zn—O based amorphous oxide semiconductor (a-IGZO). The semiconductor film 112 is formed to a thickness of 25 to 200 nm (preferably 30 to 150 nm) by a sputtering method under conditions of a pressure of 0.4 Pa and a flow rate of Ar(argon):$O_2$=50:5 (sccm), and then subsequently etching the film using hydrofluoric acid diluted to 0.05% into a desired pattern. Compared to a semiconductor film using an amorphous silicon film, the semiconductor film 112 does not need to be formed under high vacuum since there is no concern for oxidation, and is inexpensive as a process. Note that since an oxide semiconductor film containing zinc oxide is resistant against plasma, a plasma CVD (also called PCVD or PECVD) method may be used to form the film. Among CVD methods, the plasma CVD method in particular uses a simple device, and has favorable productivity.

Moreover, nitrogen may be added to the foregoing oxide semiconductor. By adding nitrogen, nitrogen works as an acceptor impurity when the oxide semiconductor film shows an n-type semiconductor property. Consequently, a threshold voltage of a transistor manufactured using an oxide semiconductor film to which nitrogen is added can be controlled. When ZnO is used for the oxide semiconductor, it is favorable that nitrogen be added (doped) to ZnO. ZnO normally shows an n-type semiconductor property. By adding nitrogen, since nitrogen works as an acceptor with respect to ZnO, a threshold voltage can be controlled as a result. In the case where the oxide semiconductor film has an n-type conductivity as it is, an impurity imparting p-type conductivity may be added to a portion of the oxide semiconductor film, in which a channel is to be formed, so that the conductivity type of the portion may be controlled so as to be closer to an i-type (intrinsic semiconductor) as much as possible.

A thermal treatment may be performed on the semiconductor film 112. By performing a thermal treatment on the semiconductor film 112, the crystallinity in the semiconductor 112 may be increased. The crystallization of the semiconductor film 112 may be performed at least in a channel formation region of the transistor By increasing the crystallinity of the channel formation region of the transistor, characteristics of the transistor can be improved.

As the thermal treatment, an RTA (rapid thermal anneal) apparatus or an LRTA (lamp rapid thermal anneal) apparatus which uses a halogen lamp or a lamp for heating can be employed. The LRTA apparatus can use light with a wavelength in an infrared rays range, a visible light range, or an ultra violet range. In the case of the LRTA apparatus, heating is performed at 250 to 570° C. (preferably 300 to 400° C., more preferably 300 to 350° C.) for 1 minute to 1 hour, preferably 10 to 30 minutes. LRTA is performed with radiation from one type or a plurality of types of lamps selected from a halogen lamp, a metal halide lamp, a xenon arc lamp, a carbon arc lamp, a high pressure sodium lamp, and a high pressure mercury lamp.

Note that instead of LRTA, a heating treatment may be performed by laser light irradiation, and for example, laser light of an infrared light laser, a visible light laser, an ultraviolet laser, or the like may be used. Alternatively, LRTA and laser light irradiation may be combined to selectively improve crystallinity of the oxide semiconductor film. When laser irradiation is performed, a continuous wave laser beam (CW laser beam) or a pulsed laser beam (pulse laser beam) can be used. As the laser beam, a beam emitted from one or plural kinds of a gas laser such as an Ar laser, a Kr laser, or an excimer laser; a laser using, as a medium, single crystalline YAQ, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. By emitting a laser beam from the fundamental harmonic of such a laser beam or the second harmonic to the fourth harmonic of the fundamental harmonic of the laser beam, crystallinity can be made to be favorable. Note that it is preferable to use laser light having larger energy than a band gap of the oxide semiconductor film. For example, laser light emitted from a KrF, ArE, XeCl, or an XeF excimer laser oscillator may be used.

The semiconductor film 112 is preferably formed using a light-transmitting material or a material with high light transmittance. Also, the conductive layer 107a and the conductive layer 107b are preferably formed using a light-transmitting material or a material with high light transmittance. Therefore, comparing their light transmittance, it is preferable that the conductive layer 107a and the conductive layer 107b have higher light transmittance than or approximately the same transmittance as the semiconductor film 112. This is because the conductive layer 107a and the conductive layer 107b are formed to have large areas in some cases and higher transmittance is preferable in order to increase the use efficiency of light.

Although the semiconductor film 112 is preferably formed using a light-transmitting material or a material with high light transmittance, this embodiment is not limited thereto. Even if light transmittance is low, any material can be used as long as the material can transmit light. For example, the semiconductor film 112 can include silicon (Si) or germanium (Ge). Further, the semiconductor film 112 preferably has at least any one of crystalline states selected from a single crystal (mono-crystalline) state, polycrystalline state, amorphous state, and microcrystalline (nano-crystalline, semi-amorphous) state. The amorphous state has an advantage in that the semiconductor film 112 may be formed at a low manufacturing temperature, a large semiconductor device or display device can be formed, and a substrate whose melting point is lower than that of glass can be used, or the like, which is preferable.

Since the semiconductor film 112 preferably functions as the semiconductor, the semiconductor film 112 preferably has a resistivity that is appropriate for the semiconductor. On the other hand, the conductive layers 107a and 107b preferably function as conductors. Therefore, the semiconductor film 112 preferably has higher resistivity than the conductive layer 107a and the conductive layer 107b.

Figure 5C:
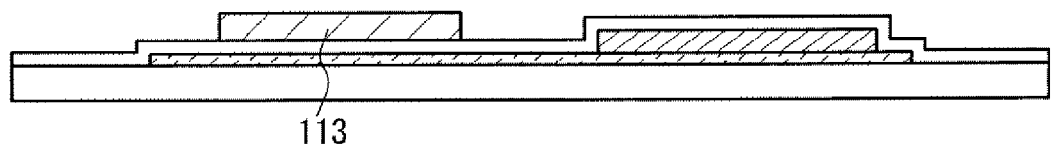

Next, a resist mask (not shown) is formed over the semiconductor film 112 by a photolithography method, and then etching is performed by using the resist mask to form a semiconductor layer 113 (also referred to as an island-shaped semiconductor layer) which is processed into a desired shape, as shown in FIG. 4C and FIG. 5C. For the etching, hydrofluoric acid diluted to 0.05%, hydrochloric acid, or the like can be used.

The semiconductor layer 113 can function as a semiconductor layer (active layer) of the transistor or part of the semiconductor layer (active layer) of the transistor. Alternatively, the semiconductor layer 113 can function as a MOS capacitor or part of the MOS capacitor. Alternatively, the semiconductor layer 113 can function as a film for reducing parasitic capacitance at the intersection portion of wirings. Although not shown, a semiconductor layer containing an impurity element imparting one conductivity type for forming source and drain regions in the semiconductor layer 113 may be formed.

Figure 5D:
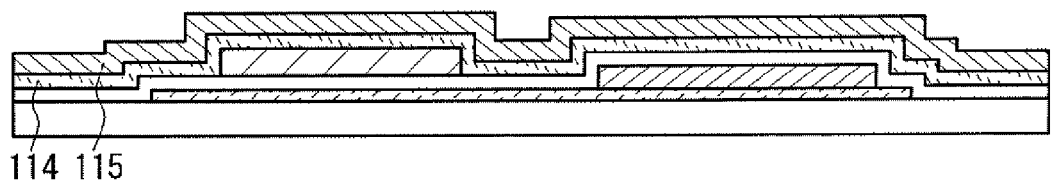

Next, as shown in FIG. 4D and FIG. 5D, a conductive film 114 and a conductive film 115 are formed so as to be stacked and cover the semiconductor 113 and the insulating film 111 by a sputtering method. These steps are consecutively performed, and further, sputtering can be consecutively performed by using a multi-chamber. By consecutively forming the conductive film 114 and the conductive film 115, throughput is increased and contamination by an impurity or dust can be suppressed.

It is preferable that the light transmittance of the conductive film 114 be sufficiently high. Moreover, it is preferable that the light transmittance of the conductive film 114 be higher than that of the conductive film 115.

As the conductive film 114, indium tin oxide (ITO), indium tin oxide containing silicon oxide (ITSO), organic indium, organic tin, zinc oxide, titanium nitride, or the like can be used. Alternatively, indium zinc oxide (IZO) containing zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. Such a material can be used for forming the conductive film 114 with a single-layer structure or a layered structure by sputtering. However, in the case of the layered structure, the light transmittance of each of a plurality of films is preferably high enough.

The conductive film 114 is preferably formed using a material approximately the same as that used for the conductive film 102. Approximately the same material is a material having the same element of a main component of the material used for the conductive film 102. In terms of impurities, the kinds and the concentration of elements contained are different in some cases. In this manner, when the light-transmitting conductive film is formed using approximately the same material by sputtering or evaporation, there is an advantage in that the material can be shared between the conductive films 102 and 114. When the material can be shared, the same manufacturing apparatus can be used, manufacturing steps can proceed smoothly, and throughput can be improved, whereby cost cut can be achieved.

The resistivity of the conductive film 115 is preferably low enough and the conductivity of the conductive film 115 is preferably high enough. In addition, the resistivity of the conductive film 114 is preferably higher than that of the conductive film 115. However, since the conductive film 114 functions as a conductive layer, the resistivity of the conductive film 114 is preferably lower than that of the insulating layer.

The conductive film 115 can be formed to have a single-layer structure or a layered structure using a metal material such as molybdenum, titanium, chromium, tantalum, tungsten, aluminum, copper, neodymium, or scandium, or an alloy material containing the above material as its main component, by sputtering or vacuum evaporation. In addition, in the case where the conductive film 115 is formed to have a layered structure, a light-transmitting conductive film may be included in the plurality of films.

Moreover, the conductive film 115 is preferably formed using a material different from that used for the conductive film 103. Alternatively, the conductive film 115 is preferably formed to have a layered structure which is different from that of the light-shielding conductive film. This is because, in manufacturing steps, temperatures applied on the conductive film 115 and the conductive film 103 are different from each other in many cases. In general, the conductive film 103 tends to have a higher temperature. Accordingly, the conductive film 103 is preferably formed using a material or a layered structure with a higher melting point. Alternatively, the conductive film 103 is preferably formed using a material or a layered structure in which hillock is less likely to occur. Alternatively, since the conductive film 115 is included in a signal line through which a video signal is supplied in some cases, the conductive film 115 is preferably formed using a material or a layered structure having lower wiring resistance than the conductive film 103.

Note that when the conductive film 115 is formed over the conductive film 114, both of the films react with each other in some cases. For example, when the top surface (a surface which is in contact with the conductive film 115) of the conductive film 114 is formed using ITO and the bottom surface (a surface which is in contact with the conductive film 114) of the conductive film 115 is formed using aluminum, a chemical reaction occurs. Accordingly, in order to avoid the chemical reaction, a material with a high melting point is preferably used for the bottom surface (the surface which is in contact with the conductive film 114) of the conductive film 115. For example, as the material with a high melting point, molybdenum (Mo), titanium (Ti), tungsten (W), neodymium (Nd), or the like can be given. Also, it is preferable to form the conductive film 115 into a multi-layer film by using a material with high conductivity over a film formed using the material with the high melting point. As the material with high conductivity, aluminum (Al), copper (Cu), silver (Ag), or the like can be given. Such materials have a light-shielding property and reflectivity.

Figure 6A:
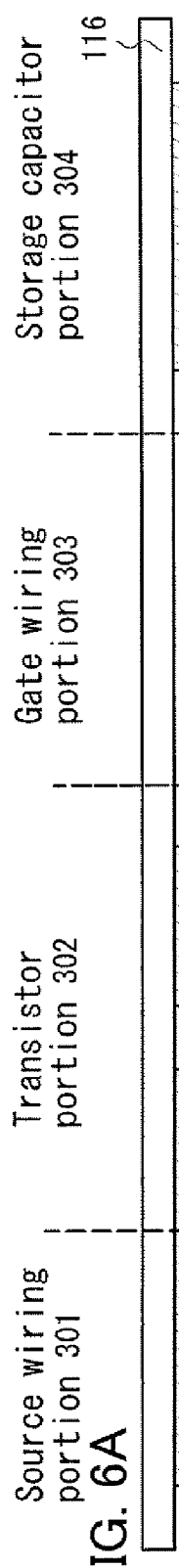
FIGS. 6A to 6C are cross-sectional views illustrating the manufacturing method of the semiconductor device of one embodiment in this invention.
Figure 6B:
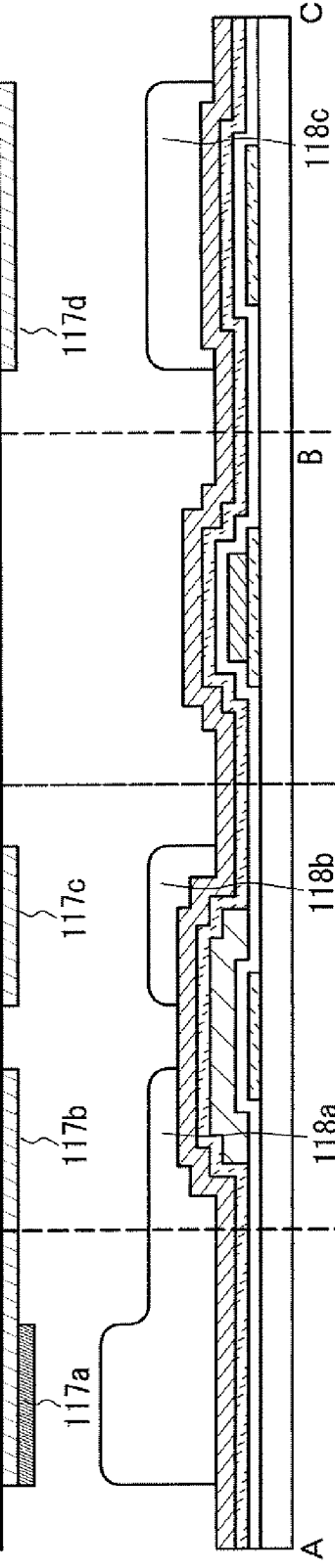
Figure 7A:
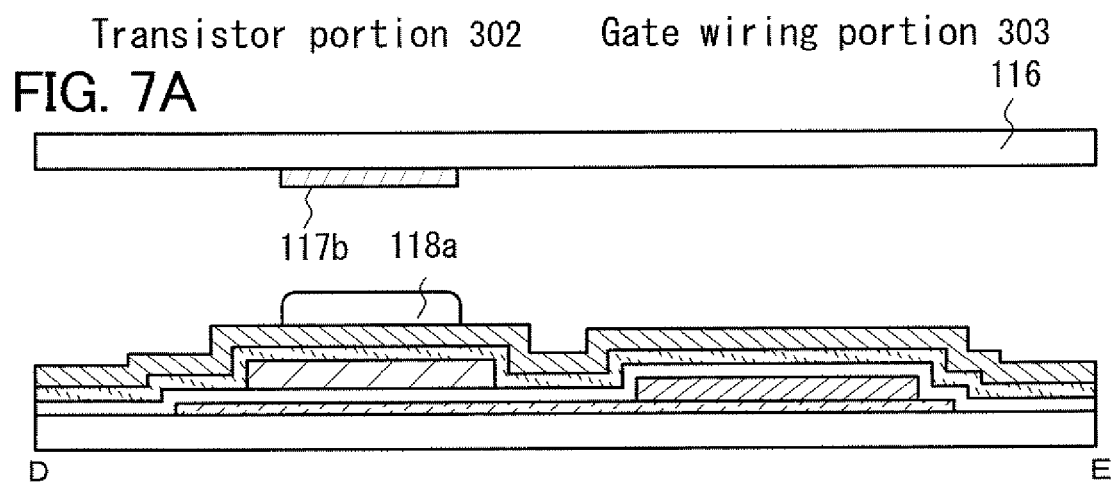
FIGS. 7A to 7C are cross-sectional views illustrating the manufacturing method of the semiconductor device of one embodiment in this invention.
Figure 7B:
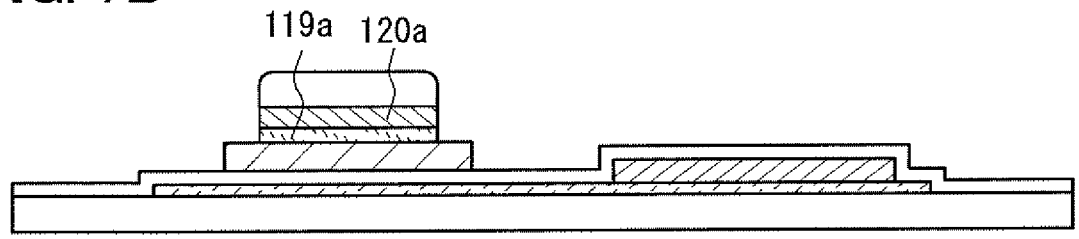

Next, as shown in FIG. 6A and FIG. 7A, resist masks 118a to 118c are formed over the conductive film 115. The resist masks 118a to 118c can be formed to have regions with different thicknesses by using a multi-tone mask.

As shown in FIG. 6A and FIG. 7A, a half-tone mask includes semi-light-transmitting layers 117b to 117d and a light-shielding layer 117a on a light-transmitting substrate 116. Accordingly, over the conductive film 115, thin resist masks are formed on portions which are to be an upper electrode of the storage capacitor portion and source and drain electrodes, and a thick resist mask is formed on a portion which is to be a source wiring.

Next, as shown in FIG. 6A and FIG. 7A, the conductive films 114 and 115 are etched by using the resist masks 118a to 118c. By the etching, conductive layers 119a, 119b, 119c, 120a, 120b, and 120c can be formed.

Here, by etching the semiconductor layer 113 with diluted hydrofluoric acid, part of a channel can be etched.

Figure 6C:
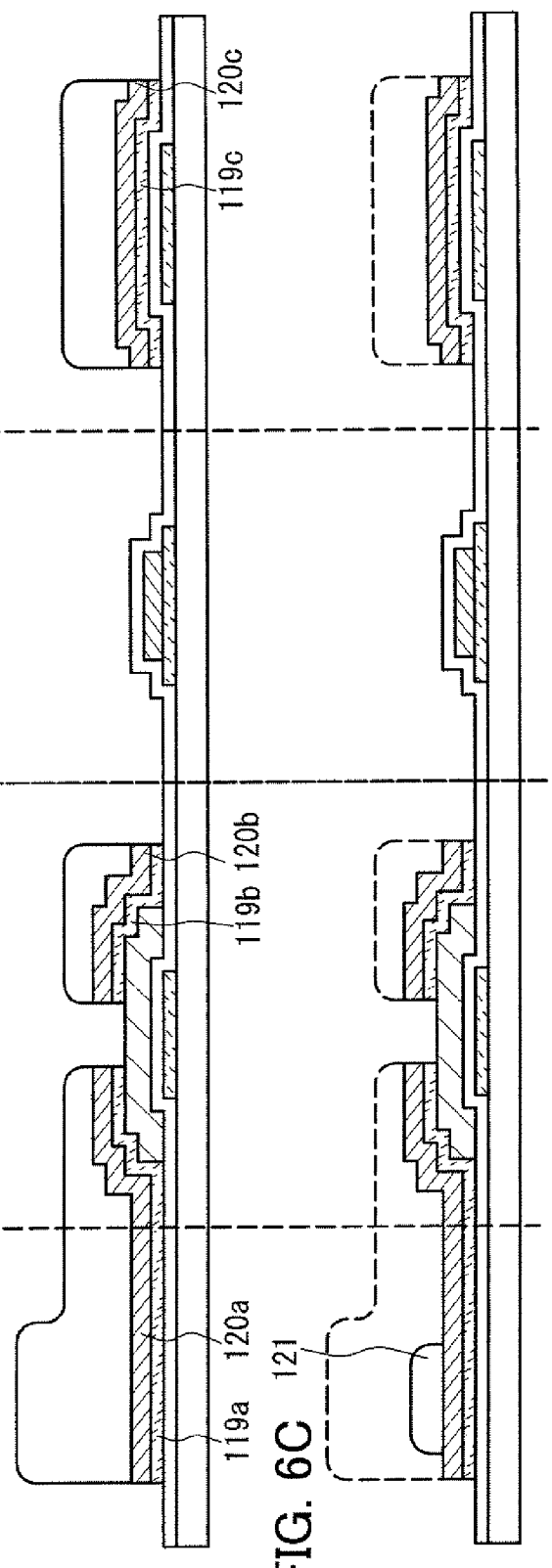
Figure 7C:
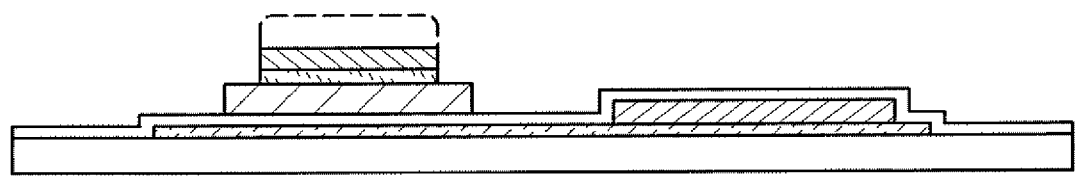

Next, as shown in FIG. 6C and FIG. 7C, the resist masks 118a to 118c are ashed by an oxygen plasma. By ashing the resist masks 118a to 118c by the oxygen plasma, the resist masks 118b and 118c are removed and the conductive layers 120b and 120c under the resist masks 118b and 118c are exposed. In addition, the resist mask 118a becomes small and remains as a resist mask 121. In this manner, by using the resist mask formed using a multi-tone mask, a resist mask is not additionally used, so that steps can be simplified.

Figure 9A:
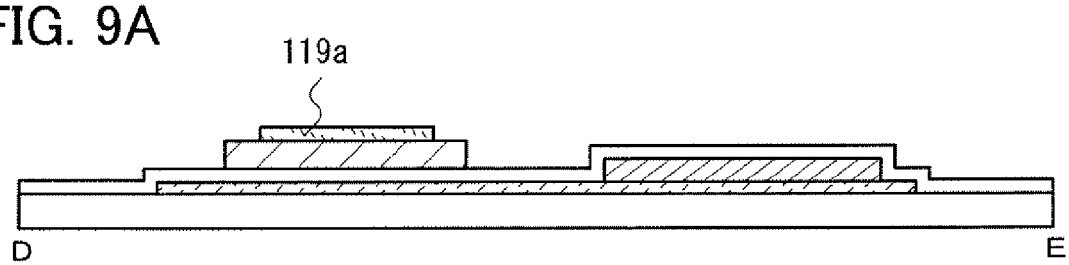
FIGS. 9A to 9D are cross-sectional views illustrating the manufacturing method of the semiconductor device of one embodiment in this invention.

Next, as shown in FIG. 8A and FIG. 9A, the light-shielding conductive layer is etched by using the resist mask 121. As a result, part of the conductive layer 120a and the conductive layer 120c are removed and the conductive layers 119b and 119c are exposed. In addition, the conductive layers 119a and 120a except a portion on which the resist mask 121 is formed is removed. This is because the conductive layers 120a is exposed due to the reduction of the resist mask 118a in size by the ashing treatment. Accordingly, the part of the light-shielding conductive layer 120a, which is not covered with the resist mask 121 is etched at the same time. Thus, the areas of the conductive layer 122 and the conductive layer 119a are largely different. In other words, the area of the conductive layer 119a is larger than that of the conductive layer 122. Alternatively, the conductive layers 122 and 119a include a region in which the conductive layers 122 and 119a overlap with each other, and a region in which the conductive layers 122 and 119a do not overlap with each other.

When the light-shielding conductive layer is removed, part of the light-transmitting, conductive layer (for example, a surface portion which is in contact with the light-shielding conductive layer) is also removed in some cases. The selectivity of the light-shielding conductive layer to the light-transmitting conductive layer in etching determines how much the light-transmitting conductive layer is removed. Therefore, for example, the thickness of the conductive layer 19a in a region covered with the conductive layer 122 is larger than that of the conductive layer 119a in a region which is not covered with the conductive layer 122 in many cases.

Note that part of a region in the conductive layers 122 and 119a (a region mainly including the conductive layer 122) can function as the source wiring or part of the source wiring while another part of the region (a region mainly including only the conductive layer 119a) can function as the source electrode or part of the source electrode of the transistor. It is preferable that a region in which the conductive layers 122 and 119a overlap with each other function as the source wiring or the part of the source wiring because the region includes the conductive layer 122 which has high conductivity in many cases. Alternatively, it is preferable that the conductive layer 119a in the region which does not include the conductive layer 122 function as the source electrode or the part of the source electrode of the transistor because the region can transmit light in some cases.

Accordingly, in the conductive layers 122 and 119a, a wiring which functions as the source electrode, may be considered to be connected to a wiring which functions as the source wiring (or at least one of the conductive layers 122 and 119a which functions as the source wiring). Alternatively, at least one of the conductive layers 122 and 119a included in the source wiring may be formed to have a larger area than the other layer included in the source wiring; part of the region with the larger area can be considered to function as the source electrode. Alternatively, the conductive layer 119a may be formed to have a larger area than the conductive layer 122; part of the region with the larger area can be considered to function as the source electrode. That is, the part of the source wiring can be considered to function as the source electrode or the part of the source electrode. Alternatively, the conductive layer 122 that mainly functions as the source wiring or the part of the source wiring can be considered to be formed over the conductive layer 119a that mainly functions as the source electrode or the part of the source electrode.

Here, as for the source electrode, since source and drain are switched to each other depending on the level of voltage, the polarity of a transistor, or the like, source can be drain.

Moreover, part of a region in the light-shielding conductive layer and the conductive layer 119c (a region mainly including the light-shielding conductive layer) can function as the capacitor wiring or part of the capacitor wiring, and another part of the region (a region mainly including only the conductive layer 119c) can function as an electrode of a capacitor element or part of the electrode of the capacitor element. It is preferable that a region in which the light-shielding conductive layer and the conductive layer 119c overlap with each other function as the capacitor wiring or the part of the capacitor wiring because the region includes the light-shielding conductive layer which has high conductivity in many cases. Alternatively, it is preferable that the conductive layer 119c in the region which does not include the light-shielding conductive layer function as the electrode of the capacitor element or the part of the electrode of the capacitor element because the region can transmit light in some cases.

Accordingly, in the light-shielding conductive layer and the conductive layer 119c, a wiring which functions as the electrode of the capacitor element, may be considered to be connected to a wiring which functions as the capacitor element (or at least one of the light-shielding conductive layer and the conductive layer 119c which functions as the capacitor wiring). Alternatively, at least one of the light-shielding conductive layer and the conductive layer 119c included in the capacitor wiring may be formed to have a larger area than the other layer included in the capacitor wiring; part of the region with the larger area can be considered to function as the electrode of the capacitor element. Alternatively, the conductive layer 119c may be formed to have a larger area than the light-shielding conductive layer; part of the region with the larger area can be considered to function as the electrode of the capacitor element. That is, the part of the capacitor wiring can be considered to function as the electrode of the capacitor element or the part of the electrode of the capacitor element. Alternatively, the conductive layer 110b that mainly functions as the capacitor wiring or the part of the capacitor wiring can be considered to be formed over the conductive layer 119c that mainly functions as the electrode of the capacitor element or the part of the electrode of the capacitor element.

Figure 9B:
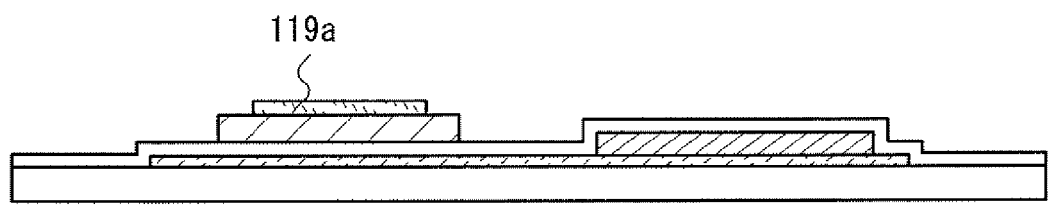
Figure 9C:
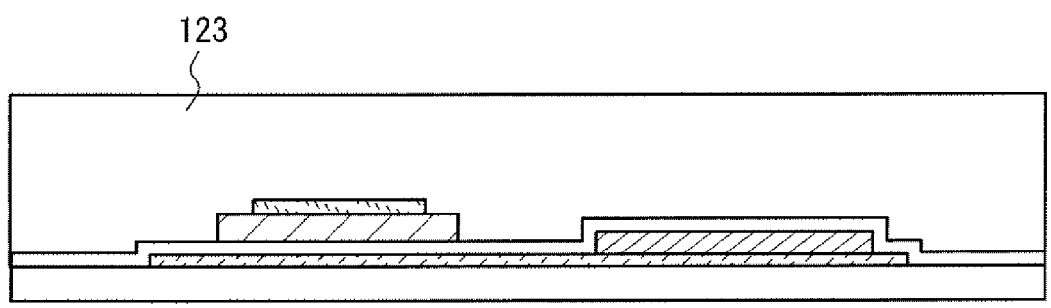

Next, as shown in FIG. 8C and FIG. 9C, the resist mask 121 is removed. In this manner, a transistor 130 and a capacitor element 131 can be formed into light-transmitting elements.

Since FIG. 9B is a cross-sectional view which is turned perpendicularly to a direction in which the source and drain electrodes are formed, the source and drain electrodes are not shown.

Next, as shown in FIG. 8B and FIG. 9B, an insulating film 123 is formed. The insulating film 123 may be formed to have a single-layer structure or a layered structure. In the case of the layered structure, the light transmittance of each of films is preferably high enough. The insulating film 123 functions as an insulating film which protects the transistor from an impurity or the like. In addition, the insulating film 123 can function as an insulating film for smoothing unevenness due to the transistor, the capacitor element, the wiring, and the like and flattening the surface on which the transistor, the capacitor element, the wiring, and the like are formed. In other words, the insulating film 123 can function as a flattening film.

In specific, since the transistor 130 and the capacitor element 131 can be formed as the light-transmitting elements, it is advantageous to flatten a top portion where these elements are formed by smoothing unevenness due to these elements or the wiring and the like in order to use the region where these elements are formed as an opening region.

The insulating film 123 is preferably formed using a film containing silicon nitride. A silicon nitride film is preferable because it has high effect of blocking impurities. Alternatively, the insulating film 123 is preferably formed using a film containing an organic material. As an example of the organic material, acrylic, polyimide, polyamide, or the like is preferable. Such organic materials are preferable in terms of a high function of flattening unevenness. Accordingly, in the case where the insulating film 123 is formed to have a layered structure of a silicon nitride film and a film of an organic material, it is preferable to provide the silicon nitride film and the film of the organic nitride in the lower side and in the upper side, respectively.

Note that the insulating film 123 can function as a color filter. By providing a color filter over the substrate 101, a counter substrate does not need to be provided with a color filter. Therefore, a margin for adjusting the position of two substrates is not necessary, whereby manufacturing of a panel can be made simple.

Next, part of the insulating film 123 or part of the insulating films 123 and 111 is removed to form a contact hole.

Figure 9D:
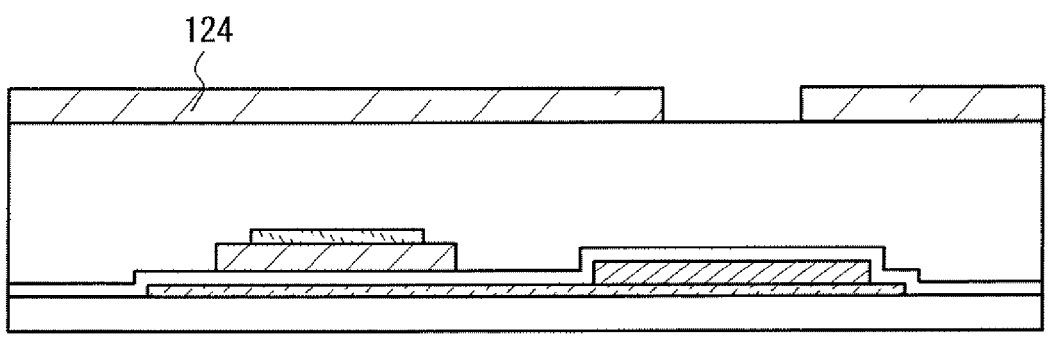

Next, as shown in FIGS. 8D and 9D, a conductive film is formed over the insulating film 123 and in the contact hole. Then, part of the conductive film is etched to form conductive films 124a and 124b. The conductive film may be formed to have a single-layer structure or a layered structure. In the case of the layered structure, the light transmittance of each of films is preferably high enough.

The conductive films 124a and 124b can function as pixel electrodes. Alternatively, the conductive films 124a and 124b can function as the electrodes of the capacitor element. Therefore, it is preferable that the conductive films 124a and 124b be formed using a light-transmitting material or a material with high light transmittance.

The conductive films 124a and 124b can connect the source wiring, the source electrode, the gate wiring, the gate electrode, the pixel electrode, the capacitor wiring, the electrode of the capacitor element and the like to each other through the contact hole. Therefore, the conductive films 124a and 124b can function as a wiring for connecting conductors.

It is preferable to form the conductive films 124a and 124b and the conductive film 102 by using approximately the same material. Alternatively, it is preferable to form the conductive films 124a and 124b and the conductive film 114 by using approximately the same material. In this manner, when the light-transmitting conductive film is formed using approximately the same material by sputtering or evaporation, there is an advantage in that the material can be shared between the conductive films. When the material can be shared, the same manufacturing apparatus can be used, manufacturing steps can proceed smoothly, and throughput can be improved, whereby cost cut can be achieved.

Figure 19:
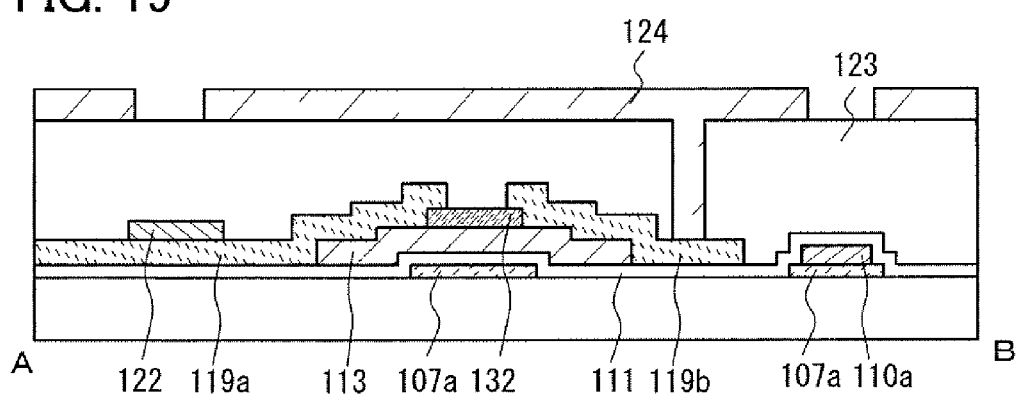
FIG. 19 is a cross-sectional view of a semiconductor device of one embodiment in this invention.

Although a manufacturing method of a channel-etched transistor is described in this embodiment, one embodiment of this invention is not limited thereto and a channel-protective transistor can also be manufactured. One example of a cross-sectional view of a channel-protective transistor is shown in FIG. 19. The channel-protective transistor can be formed through the same manner as the channel-etched transistor up to the steps in FIG. 4A and FIG. 5A. Next, in FIG. 4B and FIG. 5B, a protective film 130 is formed after the semiconductor film 112 is formed. As the protective film 132, silicon oxide, silicon nitride, silicon oxynitride, silicon nitride oxide, or the like can be used as appropriate. Next, a resist mask is formed over the protective film 132 and the protective film 132 is processed into a desired shape by etching to form a channel protective layer. After that, the same manufacturing step as the channel-etched transistor may be performed from FIG. 4C and FIG. 5C except for the step of removing part of the channel.

Through this, the light-transmitting transistor or the light-transmitting capacitor element can be formed by employing one embodiment of this invention. Therefore, even if the transistor or the capacitor element is provided in a pixel, aperture ratio can be made high. Further, since a wiring for connecting the transistor and an element (e.g., another transistor) or a wiring for connecting a capacitor element and an element (e.g., another capacitor element) can be formed by using a material with low resistivity and high conductivity, the distortion of the waveform of a signal and a voltage drop due to wiring resistance can be reduced.

Figure 10A:
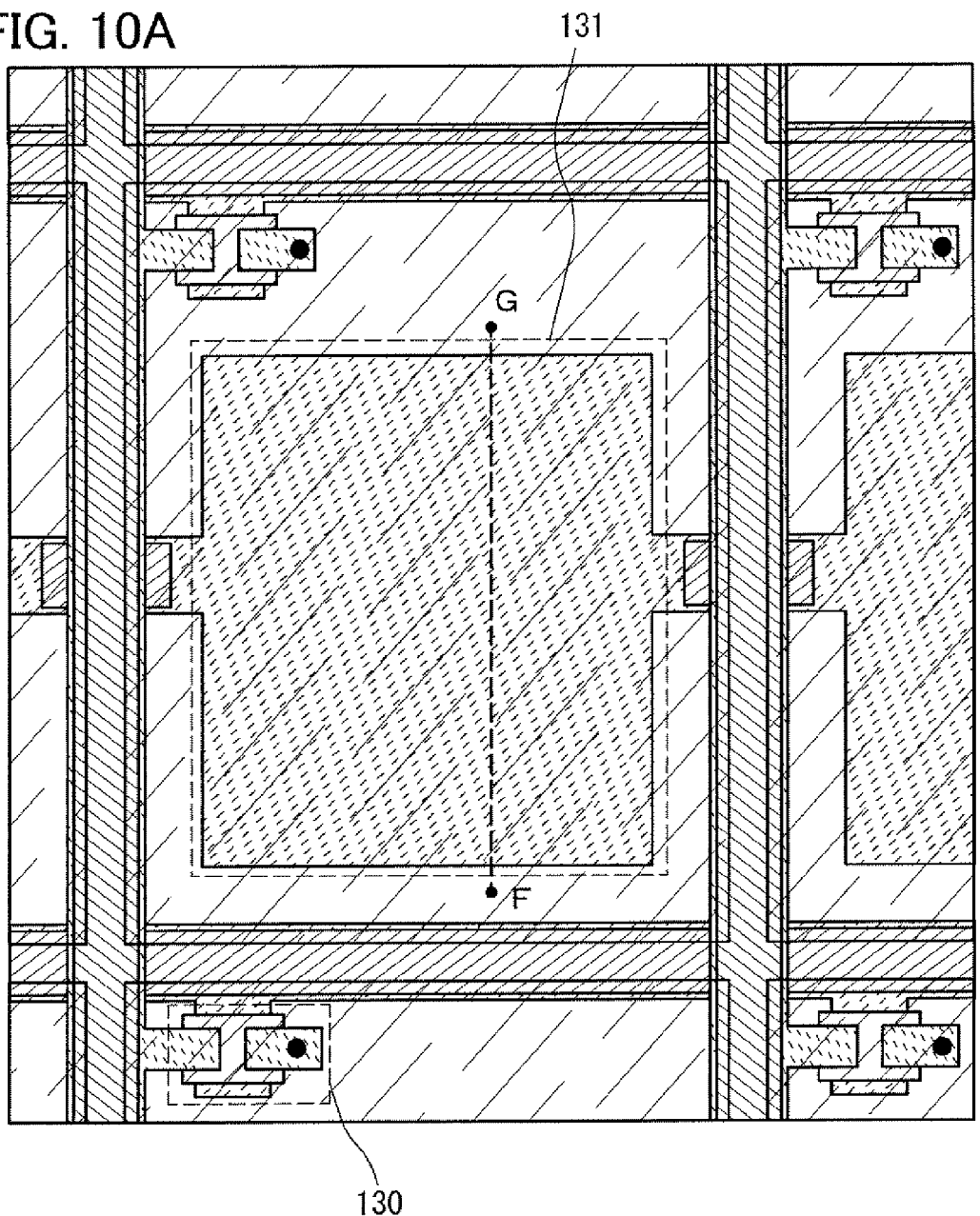
FIG. 10A is a top view of a semiconductor device of one embodiment in this invention and FIG. 10B is a cross-sectional view of the semiconductor device of one embodiment in this invention.
Figure 10B:
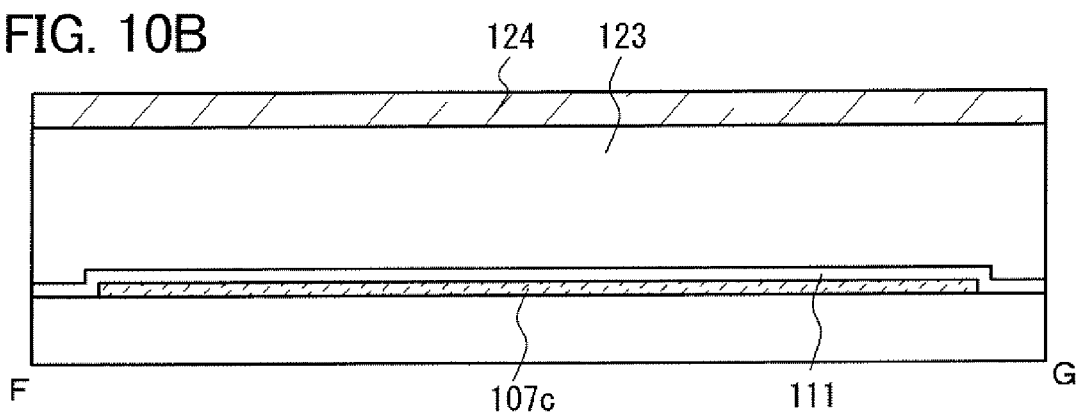

Next, another example of an element substrate which is different from that in FIGS. 1A and 1B will be described with reference to FIGS. 10A and 10B. FIG 10A is a top view of a semiconductor device of this embodiment and FIG. 10B is a cross-sectional view thereof along line F-G FIGS. 10A and 10B are different from FIGS. 1A and 1B in that the area of the lower electrode (a conductive layer 107c) of a storage capacitor portion is large and an upper electrode of the storage capacitor portion is the pixel electrode 124. The size of the storage capacitor portion is preferably larger than pixel pitch by 70% or more or 80% or more. Hereinafter, since the structure except for the storage capacitor portion and the storage capacitor wiring in FIGS. 10A and 10B is the same as that in FIGS. 1A and 1B, the detailed description thereof is skipped.

By employing such a structure, transmittance can be increased because the upper electrode of the storage capacitor portion does not need to be formed in forming the source wiring and the source and drain electrodes. In addition, the large storage capacitor portion with high transmittance can be formed. By forming the large storage capacitor portion, even if the transistor is turned off, a potential of the pixel electrode is easily stored. Moreover, feedthrough potential can be low. Further, even if the large storage capacitor portion is formed, aperture ratio can be made high and power consumption can be reduced. Furthermore, since the insulating film has two layers, interlayer short-circuiting due to a pinhole or the like generated in the insulating film can be prevented. Furthermore, the unevenness of the capacitor wiring can be smoothed and disorder of the alignment of liquid crystals can be suppressed.

Figure 11A:
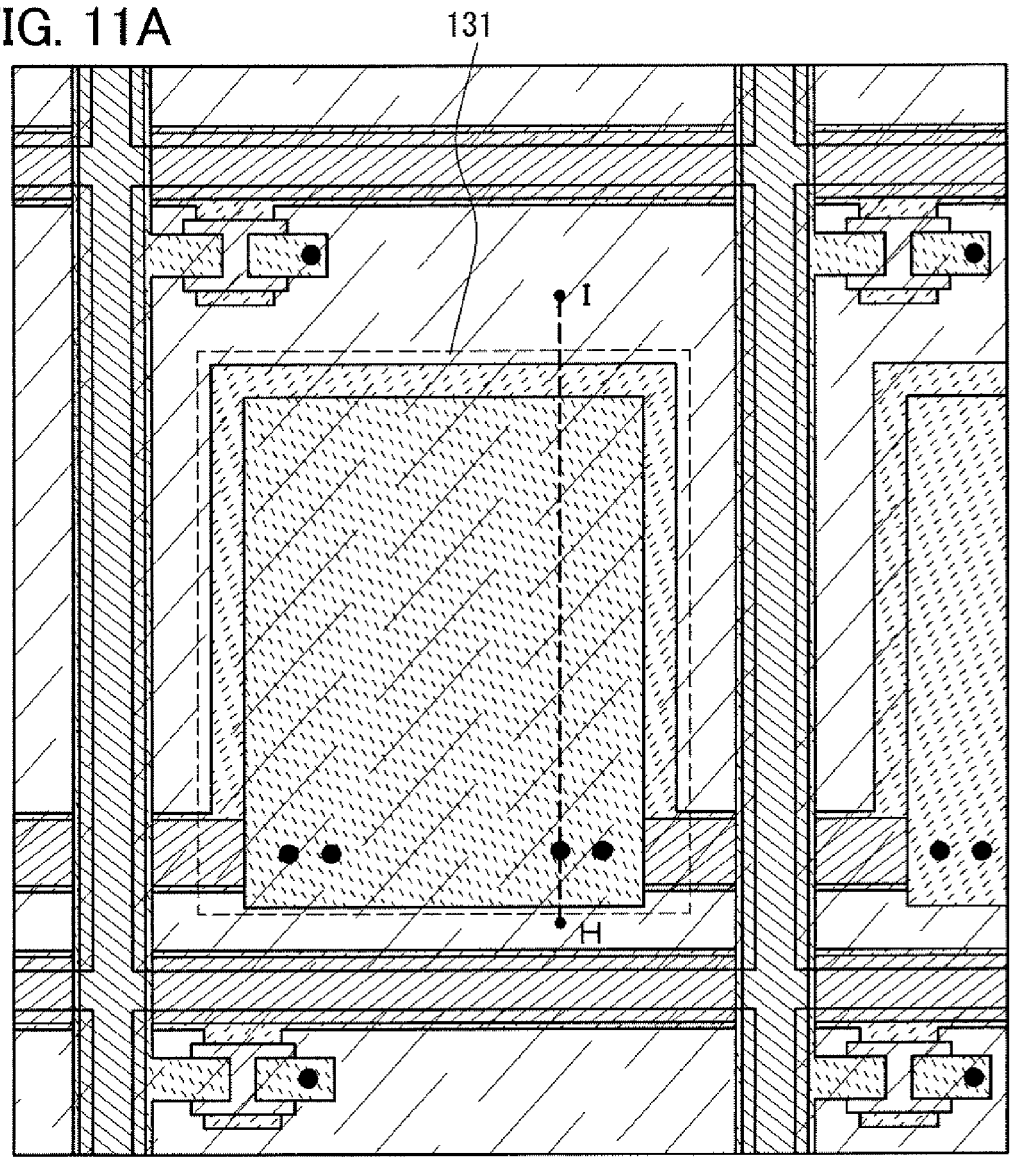
FIG. 11A is a top view of a semiconductor device of one embodiment in this invention and FIG. 11B is a cross-sectional view of the semiconductor device of one embodiment in this invention.
Figure 11B:
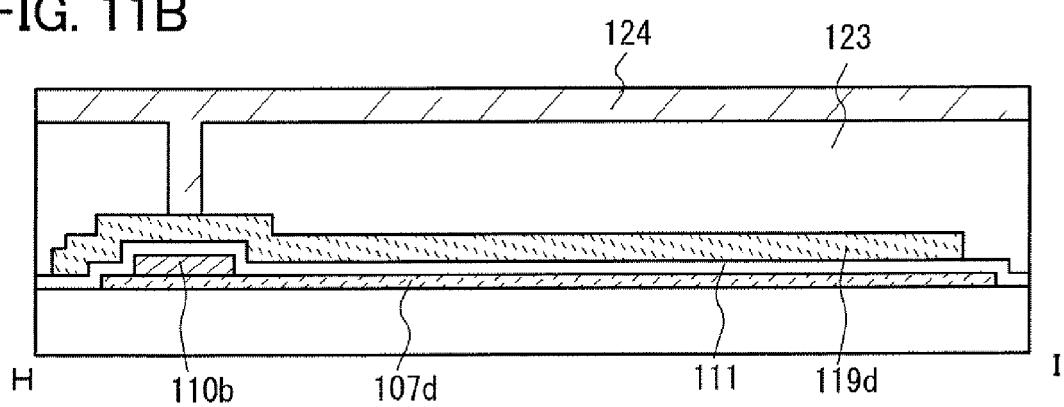

Next, another example of an element substrate which is different from that in FIGS. 1A and 1B will be described with reference to FIGS. 11A and 11B. FIG. 11A is a top view of a semiconductor device of this embodiment and FIG. 11B is a cross-sectional view thereof along line H-I. FIGS. 11A and 11B are different from FIGS. 1A and 1B in that a lower electrode (a conductive layer 107d) of the storage capacitor portion is large, a capacitor wiring is formed by stacking a light-transmitting conductive layer and a light-shielding conductive layer in this order, and an upper electrode (a conductive layer 119d) of the storage capacitor portion is large. The size of the storage capacitor portion is preferably larger than pixel pitch by 70% or more or 80% or more. Hereinafter, since the structure except for the storage capacitor portion in FIGS. 11A and 11B is the same as that in FIGS. 1A and 1B, the detailed description thereof is skipped.

By employing such a structure, the blunting of the waveform of a signal and a voltage drop due to wiring resistance can be suppressed because the capacitor wiring can be formed by using a material with low resistivity and high conductivity. In addition, even if disorder of the alignment of liquid crystals is caused by unevenness due to the contact hole in the pixel electrode, the leakage of light can be prevented by the light-shielding conductive layer in the capacitor wiring. Further, by forming the large storage capacitor, even if the transistor is turned off, a potential of the pixel electrode is easily stored. Moreover, feedthrough potential can be low. Further, even if the large storage capacitor is formed, aperture ratio can be made high and power consumption can be reduced.

Figure 12A:
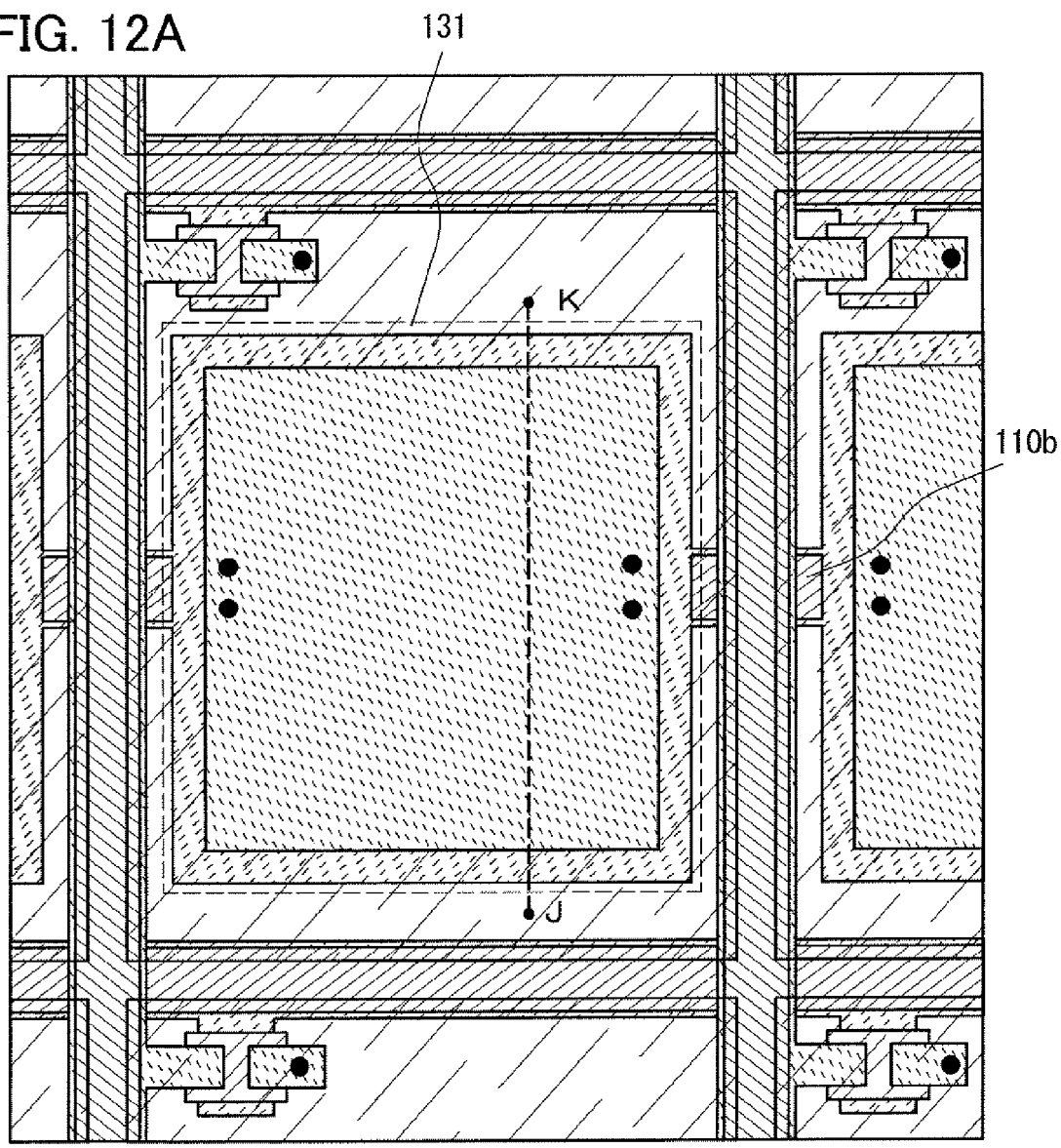
FIG. 12A is a top view of a semiconductor device of one embodiment in this invention and FIG. 12B is a cross-sectional view of the semiconductor device of one embodiment in this invention.
Figure 12B:
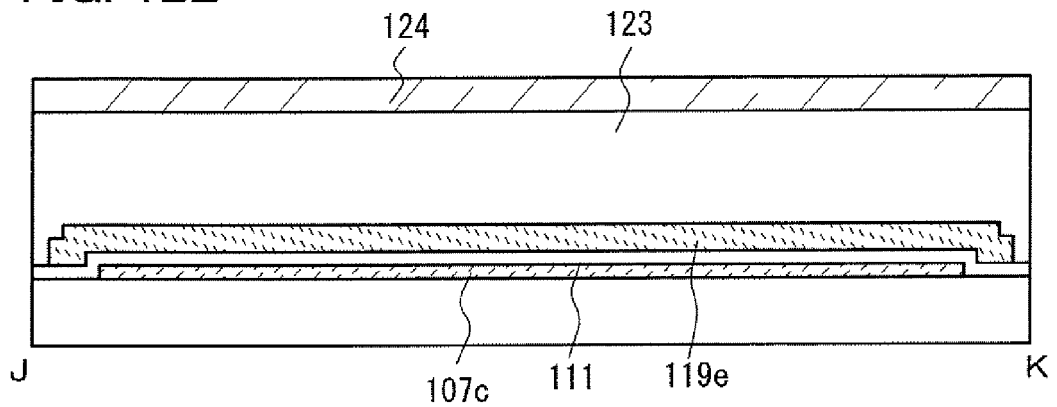

Next, another example of an element substrate which is different from that in FIGS. 1A and 1B will be described with reference to FIGS. 12A and 12B. FIG. 12A is a top view of a semiconductor device of this embodiment and FIG. 12B is a cross-sectional view thereof along line J-K. FIGS. 12A and 12B are different from FIGS. 1A and 1B in that the light-transmitting conductive layer 107c which functions as the lower electrode of the storage capacitor portion is large and the light-transmitting conductive layer 119e which functions as the upper electrode of the storage capacitor portion is large. The size of the storage capacitor portion is preferably larger than pixel pitch by 70% or more or 80% or more. Hereinafter, since the structure except the storage capacitor portion in FIGS. 12A and 12B is the same as that in FIGS. 1A and 1B, the detailed description thereof is skipped.

By employing such a structure, the large storage capacitor with high transmittance can be formed. By forming the large storage capacitor, even if the transistor is turned of, a potential of the pixel electrode is easily stored. Moreover, feedthrough potential can be low. Further, even if the large storage capacitor is formed, aperture ratio can be made high and power consumption can be reduced.

Next, the appearance and cross section of a display device of this embodiment will be described with reference to FIGS. 14A and 14B. FIG. 14A is a top view of a liquid crystal display device in which a thin film transistor 4010 including a semiconductor layer and a liquid crystal element 4013 that are formed over a first substrate 4001 are sealed with a sealant 4005 between the first substrate 4001 and a second substrate 4006. FIG. 14B is a cross-sectional view taken along line A-A' of FIG. 14A.

A sealant 4005 is provided so as to surround a pixel portion 4002 and a scanning line driver circuit 4004 which are provided over a first substrate 4001. A second substrate 4006 is provided over the pixel portion 4002 and the scanning line driver circuit 4004. Therefore, the pixel portion 4002 and the scanning line driver circuit 4004 are sealed, together with liquid crystal 4008, between the first substrate 4001 and the second substrate 4006 with the sealant 4005. A signal line driver circuit 4003 formed over a substrate, which is prepared separately, using a polycrystalline semiconductor film is mounted at a region different from the region surrounded by the sealant 4005 over the first substrate 4001. Note that although this embodiment will explain an example of attaching the signal line driver circuit 4003 including a thin film transistor formed using a polycrystalline semiconductor film to the first substrate 4001, a signal line driver circuit including a thin film transistor, which is formed using a single-crystalline semiconductor film, may be attached to the first substrate 4001. FIGS. 14A and 14B exemplifies a thin film transistor 4009 formed using a polycrystalline semiconductor film, which is included in the signal line driver circuit 4003.

The pixel portion 4002 and the scanning line driver circuit 4004 formed over the first substrate 4001 each include a plurality of thin film transistors, and the thin film transistor 4010 included in the pixel portion 4002 is illustrated as an example in FIG. 14B. The thin film transistor 4010 corresponds to a thin film transistor using a semiconductor film. Although the storage capacitor portion is not shown in the pixel portion 4002, the storage capacitor portion shown in FIGS. 1A and 1B, FIGS. 10A and 10B, FIGS. 11A and 11B, and FIGS. 12A and 12B can be formed.

As described above, the gate wiring which is electrically connected to the gate electrode of the transistor is formed by stacking the light-transmitting conductive layer and the light-shielding conductive layer in this order, and the source wiring which is electrically connected to the source and drain electrodes of the transistor is formed by stacking the light-transmitting conductive layer and the light-shielding conductive layer in this order. That is, the gate electrode of the transistor is formed using part of the light-transmitting conductive layer included in the gate wiring and the source and drain electrodes are formed using part of the light-transmitting conductive layer included in the source wiring.

By stacking the light-transmitting conductive layer and the light-shielding conductive layer in this order to form the gate wiring and the source wiring, wiring resistance and power consumption can be reduced. In addition, since the gate wiring and the source wiring are each formed using the light-shielding conductive layer, a space between pixels can be shielded from light. Accordingly, with the gate wiring provided in a row direction and the source wiring provided in a column direction, the space between the pixels can be shielded from light without using a black matrix.

In this manner, by forming the storage capacitor portion with the light-transmitting conductive layer, aperture ratio can be increased. In addition, by forming the storage capacitor portion with the light-transmitting conductive layer, the storage capacitor portion can be large, so that the potential of a pixel electrode can be easily stored even when the transistor is turned off.

Reference numeral 4013 denotes a liquid crystal element, and a pixel electrode 4030 included in the liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a portion where the pixel electrode 4030, the counter electrode 4031, and the liquid crystal 4008 overlap with each other.

Note that the first substrate 4001 and the second substrate 4006 can be formed by using glass, metal (typically, stainless steel), ceramic or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a spherical spacer which is provided to control a distance (a cell gap) between the pixel electrode 4030 and the counter electrode 4031. Note that a spacer obtained by selective etching of an insulating film may be used.

A variety of signals and potential are supplied to the signal line driver circuit 4003 which is formed separately, the scanning line driver circuit 4004, or the pixel portion 4002 via leading wirings 4014 and 4015 from an FPC 4018.

In this embodiment, a connecting terminal 4016 is formed using the same conductive film as the pixel electrode 4030 included in the liquid crystal element 4013. In addition, the leading wirings 4014 and 4015 are formed using the same conductive film as the wiring 4040.

The connecting terminal 4016 is electrically connected to a terminal of an FPC 4018 through an anisotropic conductive film 4019.

Although not shown, the liquid crystal display device shown in this embodiment includes an alignment film, a polarizing plate, and further, may include a color filter and a blocking film.

Note that FIGS. 14A and 14B illustrate an example in which the signal line driver circuit 4003 is formed separately and mounted on the first substrate 4001, but this embodiment is not limited to this structure. The scanning line driver circuit may be separately formed and then mounted, or only part of the signal line driver circuit or part of the scanning line driver circuit may be separately formed and then mounted.

Figure 18A:
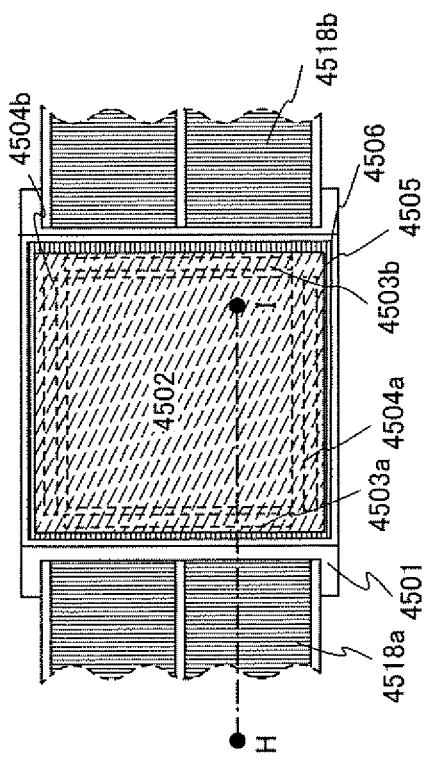
FIG. 18A is a top view of a display device of one embodiment in this invention and FIG. 18B is a cross-sectional view of the display device of one embodiment in this invention.
Figure 18B:
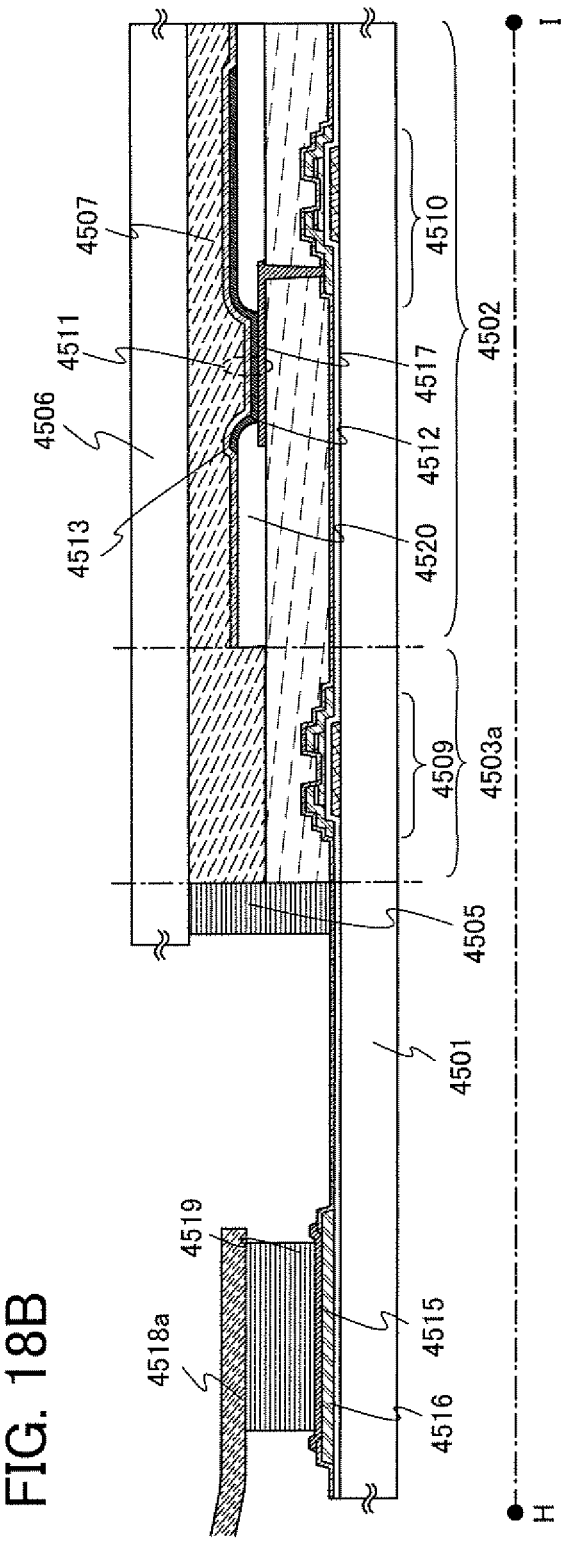

Next, the appearance and cross section of a light-emitting display panel (also referred to as a light-emitting panel) which corresponds to one embodiment of a semiconductor device will be described with reference to FIGS. 18A and 18B. FIG. 18A is a top view of a panel in which highly reliable thin film transistors 4509 and 4510 which include semiconductor layers of In—Ga—Zn—O-based non-single crystal films described in Embodiment 1, and a light-emitting element 4511, which are formed over a first substrate 4501, are sealed between the first substrate 4501 and a second substrate 4506 with a sealing material 4505. FIG. 18B corresponds to a cross-sectional view of FIG. 18A along line H-I.

The sealing material 4505 is provided so as to surround a pixel portion 4502, a signal line driver circuits 4503a and 4503b, and scan line driver circuits 4504a and 4504b which are provided over the first substrate 4501. In addition, the second substrate 4506 is formed over the pixel portion 4502, the signal line driver circuits 4503a and 4503b, and scanning line driver circuits 4504a and 4504b. Accordingly, the pixel portion 4502, the signal line driver circuits 4503a and 4503b, and the scanning line driver circuits 4504a and 4504b are sealed, together with a filler 4507, with the first substrate 4501, the sealing material 4505, and the second substrate 4506. In this manner, it is preferable that the pixel portion 4502, the signal line driver circuits 4503a and 4503b, and the scanning line driver circuits 4504a and 4504b be packaged (sealed) with a protective film (such as an attachment film or an ultraviolet curable resin film) or a cover material with high air-tightness and little degasification so that the pixel portion 4502, the signal line driver circuits 4503a and 4503b, and the scanning line driver circuits 4504a and 4504b is not exposed to external air.

The pixel portion 4502, the signal line driver circuits 4503a and 4503b, and the scanning line driver circuits 4504a and 4504b formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 18B.

As the thin film transistors 4509 and 4510, highly reliable thin film transistors shown in Embodiment 1 including In—Ga—Zn—O-based non-single-crystal films as semiconductor layers can be used. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to source and drain electrode layers of the thin film transistor 4510. Note that although the light-emitting element 4511 has a layered structure of the first electrode layer 4517, an electric field light-emitting layer 4512, and the second electrode layer 4513, the structure of the light-emitting element 4511 is not limited to the structure shown in this embodiment. The structure of the light-emitting element 4511 can be changed as appropriate depending on a direction in which light is extracted from the light-emitting element 4511, or the like.

The partition wall 4520 is formed using an organic resin film, an inorganic insulating film, or organic polysiloxane. It is particularly preferable that the partition wall 4520 be formed using a photosensitive material to have an opening portion on the first electrode layer 4517 so that a sidewall of the opening portion is formed as a tilted surface with continuous curvature.

The electric field light-emitting layer 4512 may be formed using a single layer or a plurality of layers stacked.

In order to prevent entry of oxygen, hydrogen, carbon dioxide, water, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied to the signal line driver circuits 4503a and 4503b, the scanning line driver circuits 4504a and 4504b, or the pixel portion 4502 from FPCs 4518a and 4518b.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518a through an anisotropic conductive film 4519.

As the second substrate located in the direction in which light is extracted from the light-emitting element 4511 needs to have a light-transmitting property. In that case, a light transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicon resin, PVB (polyvinyl butyral), or EVA (ethylene vinyl acetate) can be used. In this embodiment, nitrogen is used for the filler 4507.

In addition, if needed, optical films, such as a polarizer, a circular polarizer (including an elliptical polarizer), a retarder plate (a quarter-wave plate, a half-wave plate), a color filter, and the like, may be provided on a projection surface of the light-emitting element as appropriate. Further, the polarizing plate or the circulary polarizing plate may be provided with an anti-reflection film. For example, an anti-glare treatment which can diffuse reflected light in the depression/projection of the surface, and reduce glare can be performed.

The signal line driver circuits 4503a and 4503b and the scanning line driver circuits 4504a and 4504b may be mounted as a driver circuit formed by using a single-crystal-semiconductor film or polycrystalline semiconductor film over a substrate separately prepared. In addition, only the signal line driver circuit or part thereof or the scanning line driver circuit or part thereof may be separately formed to be mounted. This embodiment is not limited to the structure shown in FIGS. 18A and 18B.

Through this process, a highly reliable light emitting display device (display panel) as a semiconductor device can be manufactured.

Through this, the light-transmitting transistor or the light-transmitting capacitor element can be formed in the pixel portion by employing this embodiment to form a display device. Therefore, even if the transistor or the capacitor element is provided in a pixel, aperture ratio can be made high. Accordingly, a display device with high luminance can be manufactured. Further, since a wiring for connecting the transistor and an element (e.g., another transistor) or a wiring for connecting a capacitor element and an element (e.g., another capacitor element) can be formed by using a material with low resistivity and high conductivity, the distortion of the waveform of a signal and a voltage drop due to wiring resistance can be suppressed.

This embodiment can be implemented in combination with the structure of another embodiment.

(Embodiment 2)

An element substrate of one embodiment of this invention and a display device or the like including the element substrate can be used for an active matrix display panel. That is, one embodiment of the invention can be carried out in all electronic devices in which they are incorporated into a display portion.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). Examples of these devices are illustrated in FIGS. 15A to 15C.

Figure 15A:
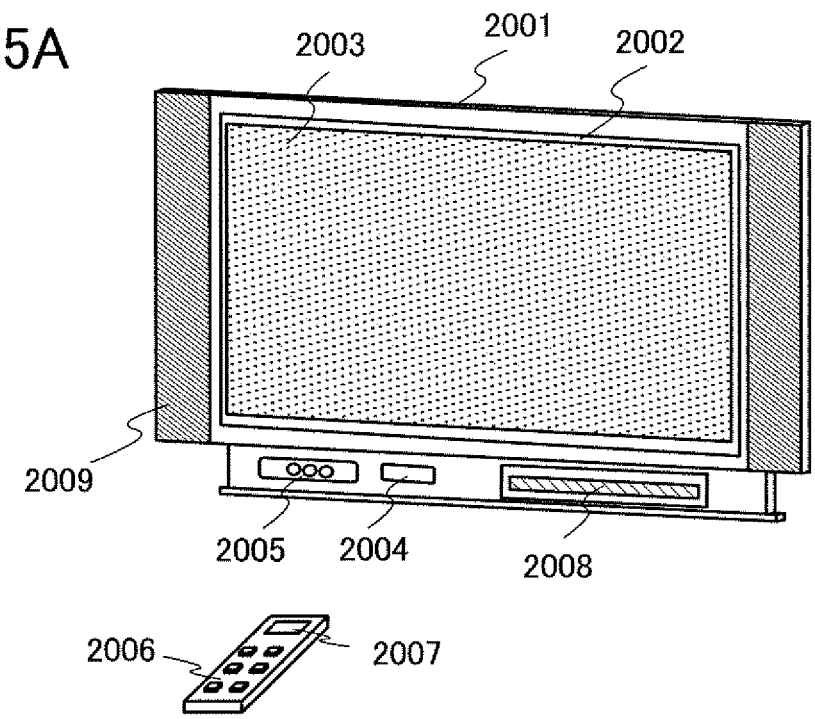
FIGS. 15A to 15C are diagrams each illustrating an electronic device which employs a display device of one embodiment in this invention.
Figure 15B:
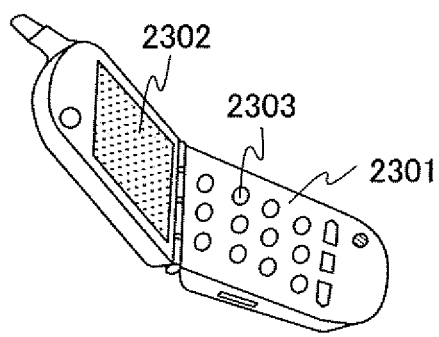
Figure 15C:
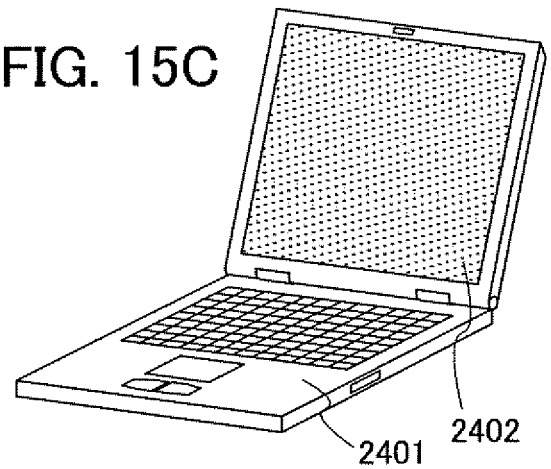

FIG. 15A illustrates a television device. The television device can be completed by incorporating a display panel in a chassis, as illustrated in FIG. 15A. A main screen 2003 is formed using the display panel, and other accessories such as a speaker portion 2009 and an operation switch are provided. In such a manner, a television device can be completed.

As shown in FIG. 15A, a display panel 2002 using a display element is incorporated into a housing 2001, as shown in FIG. 15A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated by using a switch built in the housing or a remote control unit 2006. Also, a display portion 2007 for displaying output information may also be provided in the remote control unit.

Further, the television device may include a sub-screen 2008 formed using a second display panel for displaying channels, sound volume, and the like, in addition to the main screen 2003. In this structure, the main screen 2003 may be formed with a liquid crystal display panel which has an excellent viewing angle, and the sub-screen 2008 may be formed with a light-emitting display panel by which display is possible with low power consumption. Alternatively, when reduction in power consumption is prioritized, a structure may be employed in which the main screen 2003 is formed using a light-emitting display panel, the sub-screen is formed using a light-emitting display panel, and the sub-screen can be turned on and off.

By employing one embodiment of this invention, a pixel with a high aperture ratio can be formed, whereby a display device with high luminance can be manufactured. Accordingly, low power consumption in a television device can be achieved.

FIG. 15B illustrates one mode of a cellular phone 2301. The cellular phone 2301 includes a display portion 2302, operation switches 2303, and the like. In the display portion 2302, by employing one embodiment of this invention, a pixel with a high aperture ratio can be formed, whereby a display device with high luminance can be manufactured. Accordingly, low power consumption in a cell phone can be achieved.

In addition, a portable computer illustrated in FIG. 15C includes a main body 2401, a display portion 2402, and the like. By employing one embodiment of this invention, a pixel with a high aperture ratio can be formed, whereby a display device with high luminance can be manufactured. Accordingly, low power consumption in a computer can be achieved.

Figure 16A:
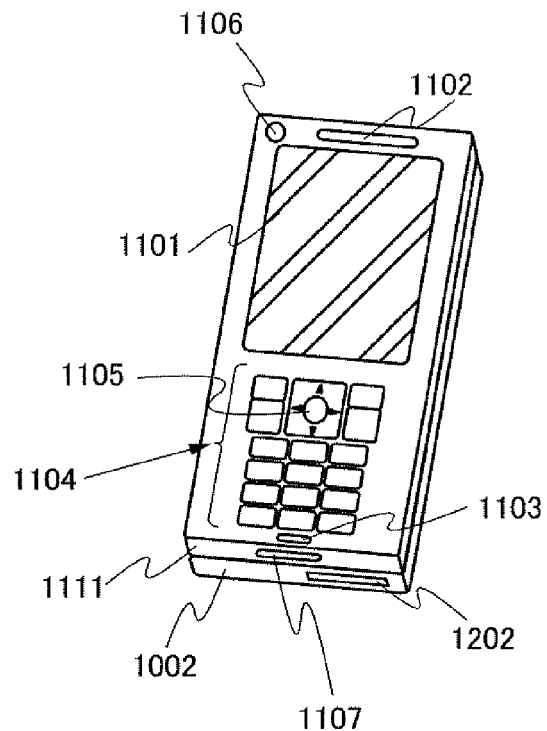
FIG. 16A to 16C are diagrams illustrating an electronic device which employs a display device of one embodiment in this invention.
Figure 16B:
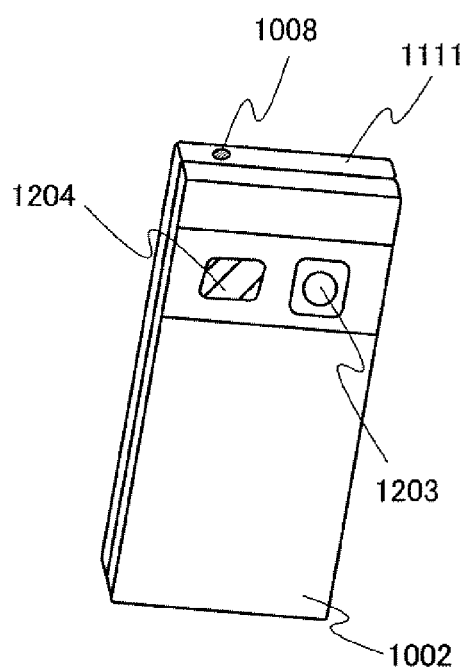
Figure 16C:
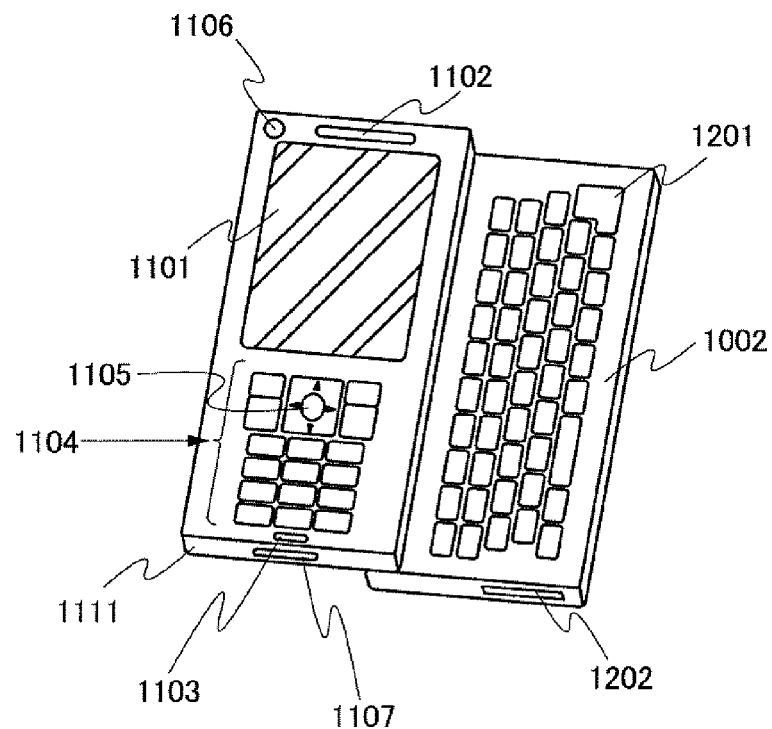

FIGS. 16A to 16C show one example of the structure of a smartphone. For example, an element substrate including a thin film transistor and a display device including the element substrate, which are shown in Embodiment 1 are applied to a display portion of the smartphone. FIG. 16A is a front view, FIG. 16B is a rear view, and FIG. 16C is a development view. The smartphone has two housings 1111 and 1002. The smartphone has both functions of a mobile phone and of a portable information terminal, incorporates a computer, and enables various kinds of data processing in addition to telephone conversation, and is also referred to as a smartphone.

The cell phone has two housings the 1111 and 1002. The housing 1111 includes a display portion 1101, a speaker 1102, a microphone 1103, operation keys 1104, a pointing device 1105, a front camera lens 1106, a jack 1107 for an external connection terminal, an earphone terminal 1008, and the like, while the housing 1002 includes a keyboard 1201, an external memory slot 1202, a rear camera 1203, a light 1204, and the like. In addition, an antenna is incorporated in the housing 1111.

Further, in addition to the above-described structure, the smartphone may incorporate a non-contact IC chip, a small size memory device, or the like.

In FIG. 16A, the housing 1111 and the housing 1002 overlap each other The housing 1111 and the housing 1002 slid to be developed from the state in FIG. 16A to the state in FIG. 16C. In the display portion 1101, the display device described in the above embodiment can be incorporated, and a display direction can be changed depending on a use mode. Because the front camera lens 1106 is provided in the same plane as the display portion 1101, the smartphone can be used as a videophone. A still image and a moving image can be taken by the rear camera 1203 and the light 1204 by using the display portion 1101 as a viewfinder.

The speaker 1102 and the microphone 1103 can be used for videophone, recording, playback, and the like without being limited to verbal communication. With the use of operation keys 1104, making and receiving calls, inputting simple information related to e-mails or the like, scrolling of the screen, moving the cursor and the like are possible.

If much information is needed to be treated, such as documentation, use as a portable information terminal, and the like, the use of the keyboard 1201 is convenient. The housings 1111 and 1002 overlapping each other can slide and be developed as illustrated in FIG. 16C, so that the smartphone can be used as an information terminal. Also, a cursor can be used with smooth operation by using the keyboard 1201 and the pointing device 1105. To the jack 1107 for an external connection terminal, an AC adaptor and various types of cables such as a USB cable can be connected, and charging and data communication with a personal computer or the like are possible. Moreover, a large amount of data can be stored by inserting a storage medium into the external memory slot 1202 and can be moved.

In the rear surface of the housing 1002 (FIG. 16B), the rear camera lens 1203 and the light 1204 are provided, and a still image and a moving image can be taken by using the display portion 1101 as a finder.

Further, the smartphone may have an infrared communication function, a USB port, a function of receiving one segment television broadcast, a non-contact IC chip, an earphone jack, or the like, in addition to the above-described functions and structures.

By employing the display device described in the above embodiment, a smartphone with improved image quality can be provided.

Note that this embodiment can be combined with any of the other embodiment as appropriate.

This application is based on Japanese Patent Application serial no. 2008-130162 filed with Japan Patent Office on May 16, 2008, the entire contents of which are hereby incorporated by reference.

What is claimed is:
1. A semiconductor device comprising:
a first conductive film;
a second conductive film over the first conductive film;
a first insulating film over the first conductive film and the second conductive film;
a semiconductor film provided over the first insulating film;
a third conductive film over the semiconductor film;
a fourth conductive film over the third conductive film;
a second insulating film covering the semiconductor film, the third conductive film and the fourth conductive film;
a pixel electrode provided over the second insulating film and electrically connected to the semiconductor film;
a transistor using a first portion of the first conductive film as a gate electrode, a first portion of the third conductive film as a source electrode and a first portion of the first insulating film as a gate dielectric; and
a storage capacitor using a second portion of the third conductive film as an upper electrode, a second portion of the first conductive film as a lower electrode, and a second portion of the first insulating film as a dielectric,
wherein an entirety of the second conductive film overlaps with the first conductive film while the first portion of the first conductive film and the second portion of the first conductive film do not overlap with the second conductive film,
wherein an entirety of the fourth conductive film overlaps with the third conductive film while the first portion of the third conductive film and the second portion of the third conductive film do not overlap with the fourth conductive film,
wherein the semiconductor film does not overlap with the second conductive film, and
wherein the storage capacitor is transparent such that a light passes through the storage capacitor from one of the first insulating film and the second insulating film to the other of the first insulating film and the second insulating film.

2. The semiconductor device according to claim 1, wherein the first conductive film and the third conductive film have a light-transmitting property.

3. The semiconductor device according to claim 1, wherein the second conductive film and the fourth conductive film have a light-shielding property.

4. The semiconductor device according to claim 1, wherein the second conductive film and the fourth conductive film have higher conductivity than the first conductive film and the third conductive film.

5. The semiconductor device according to claim 1, wherein the second conductive film is formed of one or a plurality of elements selected from Al, Ti, Cu. Au, Ag, Mo, Ni, Ta, Zr, and Co.

6. The semiconductor device according to claim 1, wherein the fourth conductive film is formed of one or a plurality of elements selected from Al, Ti, Cu, Au, Ag, Mo, Ni, Ta, Zr, and Co.

7. The semiconductor device according to claim 1, wherein the semiconductor film is any one of materials selected from zinc oxide, titanium oxide, magnesium zinc oxide, cadmium zinc oxide, cadmium oxide, $InGaO_3(ZnO)_5$, and a-IGZO.

8. The semiconductor device according to claim 1,
wherein the fourth conductive film does not overlap with the semiconductor film.

9. A semiconductor device comprising:
a first conductive film;
a second conductive film over the first conductive film;
a first insulating film over the first conductive film and the second conductive film;
a semiconductor film provided over the first insulating film;
a third conductive film over the semiconductor film;
a fourth conductive film over the third conductive film;
a second insulating film covering the semiconductor film, the third conductive film and the fourth conductive film;
a pixel electrode provided over the second insulating film and electrically connected to the semiconductor film;
a transistor using a first portion of the first conductive film as a gate electrode, a first portion of the third conductive film as a source electrode and a first portion of the first insulating film as a gate dielectric;
a capacitor wiring; and
a storage capacitor using a second portion of the third conductive film as an upper electrode, a second portion of the first conductive film as a lower electrode, and a second portion of the first insulating film as a dielectric,
wherein an entirety of the second conductive film overlaps with the first conductive film while the first portion of the first conductive film and the second portion of the first conductive film do not overlap with the second conductive film, wherein an entirety of the fourth conductive film overlaps with the third conductive film while the first portion of the third conductive film and the second portion of the third conductive film do not overlap with the fourth conductive film, wherein the semiconductor film does not overlap with the second conductive film, wherein the storage capacitor is transparent such that a light passes through the storage capacitor from one of first insulating film and the second insulating film to the other of the first insulating film and the second insulating film, and wherein the capacitor wiring comprises a same material as the semiconductor film.

10. The semiconductor device according to claim 9, wherein the first conductive film and the third conductive film have a light-transmitting property.

11. The semiconductor device according to claim 9, wherein the second conductive film and the fourth conductive film have a light-shielding property.

12. The semiconductor device according to claim 9, wherein the second conductive film and the fourth conductive film have higher conductivity than the first conductive film and the third conductive film.

13. The semiconductor device according to claim 9, wherein the second conductive film is formed of one or a plurality of elements selected from Al, Ti, Cu, Au, Ag, Mo, Ni, Ta, Zr, and Co.

14. The semiconductor device according to claim 9, wherein the fourth conductive film is formed of one or a plurality of elements selected from Al, Ti, Cu, Au, Ag, Mo, Ni, Ta, Zr, and Co.

15. The semiconductor device according to claim 9, wherein the semiconductor film is any one of materials selected from zinc oxide, titanium oxide, magnesium zinc oxide, cadmium zinc oxide, cadmium oxide, $InGaO_3(ZnO)_5$, and a-IGZO.

16. The semiconductor device according to claim 9, wherein the fourth conductive film does not overlap with the semiconductor film.

17. A semiconductor device comprising:
a first conductive film;
a second conductive film;
a first insulating film over the first conductive film and the second conductive film;
a semiconductor film provided over the first insulating film;
a third conductive film over the semiconductor film;
a fourth conductive film over the third conductive film;
a second insulating film covering the semiconductor film, the third conductive film and the fourth conductive film;
a pixel electrode provided over the second insulating film and electrically connected to the semiconductor film;
a transistor using a first portion of the first conductive film as a gate electrode, a first portion of the third conductive film as a source electrode and a first portion of the first insulating film as a gate dielectric; and
a storage capacitor using a second portion of the third conductive film as an upper electrode, a second portion of the first conductive film as a lower electrode, and a second portion of the first insulating film as a dielectric, wherein an entirety of the second conductive film overlaps with the first conductive film while the first portion of the first conductive film and the second portion of the first conductive film do not overlap with the second conductive film, wherein an entirety of the fourth conductive film overlaps with the third conductive film while the first portion of the third conductive film and the second portion of the third conductive film do not overlap with the fourth conductive film, and wherein the storage capacitor is transparent such that a light passes through the storage capacitor from one of the first insulating film and the second insulating film to the other of the first insulating film and the second insulating film.

18. The semiconductor device according to claim 17, wherein the first conductive film and the third conductive film have a light-transmitting property.

19. The semiconductor device according to claim 17, wherein the second conductive film and the fourth conductive film have a light-shielding property.

20. The semiconductor device according to claim 17, wherein the second conductive film and the fourth conductive film have higher conductivity than the first conductive film and the third conductive film.

21. The semiconductor device according to claim 17, wherein the second conductive film is formed of one or a plurality of elements selected from Al, Ti, Cu, Au, Ag, Mo, Ni, Ta, Zr, and Co.

22. The semiconductor device according to claim 17, wherein the fourth conductive film is formed of one or a plurality of elements selected from Al, Ti, Cu, Au, Ag, Mo, Ni, Ta, Zr, and Co.

23. The semiconductor device according to claim 17, wherein the semiconductor film is any one of materials selected from zinc oxide, titanium oxide, magnesium zinc oxide, cadmium zinc oxide, cadmium oxide, $InGaO_3(ZnO)_5$, and a-IGZO.

24. The semiconductor device according to claim 17, wherein the fourth conductive film does not overlap with the semiconductor film.

* * * * *